United States Patent
Seyama et al.

(10) Patent No.: US 6,781,799 B2
(45) Date of Patent: Aug. 24, 2004

(54) CURRENT PERPENDICULAR-TO-THE-PLANE STRUCTURE SPIN VALVE MAGNETORESISTIVE HEAD

(75) Inventors: Yoshihiko Seyama, Kawasaki (JP); Atsushi Tanaka, Kawasaki (JP); Keiichi Nagasaka, Kawasaki (JP); Yutaka Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 390 days.

(21) Appl. No.: 09/821,185

(22) Filed: Mar. 29, 2001

(65) Prior Publication Data

US 2002/0097538 A1 Jul. 25, 2002

(30) Foreign Application Priority Data

Nov. 16, 2000 (JP) .................................... 2000-349106

(51) Int. Cl.$^7$ .............................................. G11B 5/127
(52) U.S. Cl. ................................................ 360/324.11
(58) Field of Search ........................ 360/314, 324.11, 360/324.12, 324.2, 319, 313

(56) References Cited

U.S. PATENT DOCUMENTS

| | | | | |
|---|---|---|---|---|
| 5,793,207 A | * | 8/1998 | Gill | 324/252 |
| 6,278,589 B1 | * | 8/2001 | Gill | 360/314 |
| 6,396,668 B1 | * | 5/2002 | Mao et al. | 360/314 |
| 6,424,508 B1 | * | 7/2002 | Tadokoro et al. | 360/324.2 |
| 6,538,856 B1 | * | 3/2003 | Gill | 360/319 |
| 6,583,969 B1 | * | 6/2003 | Pinarbasi | 360/324.11 |

FOREIGN PATENT DOCUMENTS

| | | | |
|---|---|---|---|
| JP | 10105928 A | * | 4/1998 |
| JP | 2002157711 A | * | 5/2002 |
| WO | WO97/44781 | | 11/1997 |

* cited by examiner

*Primary Examiner*—Allen Cao
(74) *Attorney, Agent, or Firm*—Greer, Burns & Crain, Ltd.

(57) ABSTRACT

A current perpendicular-to-the-plane (CPP) structure spin valve magnetoresistive (MR) transducer includes an insulating layer. A pinned or free ferromagnetic layer serves to space or isolate the insulating layer from a non-magnetic spacer layer interposed between the pinned and free ferromagnetic layers. The sensing current is allowed to penetrate through the insulating layer. Fine pin-holes generally formed in the insulating layer are supposed to enable migration of electrons through the insulating layer. Similar to the situation in which the sensing current is allowed to flow through a reduced sectional area, a larger variation can be obtained in response to the inversion of the magnetization in the free ferromagnetic layer. The spin valve MR transducer is expected to greatly contribute to realization of a still higher recording density. Moreover, the spin valve MR transducer is also expected to exhibit an electric resistance approximately equal to a tenth part of that of a well-known tunnel junction magnetoresistive (TMR) element. Accordingly, a thermal noise can significantly be suppressed in the spin valve MR transducer as compared with the TMR element.

18 Claims, 26 Drawing Sheets

CURRENT PERPENDICULAR-TO-THE-PLANE STRUCTURE SPIN VALVE MAGNETORESISTIVE HEAD

BACKGROUND OF THE INVENTION

1. Field of the Invention

The present invention relates to a spin valve magnetoresistive film comprising a free ferromagnetic layer, a non-magnetic spacer layer contacting the free ferromagnetic layer over a first interface, and a pinned ferromagnetic layer contacting the non-magnetic spacer layer over a second interface. In particular, the invention relates to a so-called current perpendicular-to-the-plane (CPP) structure spin valve magnetoresistive head allowing a sensing current to flow through the spin valve magnetoresistive film in a direction perpendicular to the first and second interfaces.

2. Description of the Prior Art

As well known, the larger the number of giant magnetoresistive (GMR) films gets within a current perpendicular-to-the-plane (CPP) structure magnetoresistive head, the larger variation in the electric resistance can be detected in the overall CPP structure magnetoresistive head. A larger variation in the resistance of the CPP structure magnetoresistive head is allowed to greatly contribute to reduction in the magnitude or level of a sensing current. Specifically, the CPP structure magnetoresistive head is allowed to accurately detect the magnetic bit data with a smaller or lower sensing current. In particular, a larger variation in the resistance can be obtained in the CPP structure magnetoresistive head irrespective of reduction in the core width. A smaller core width leads to a higher density of recording tracks. The CPP structure magnetoresistive head of this type is supposed to greatly contribute to realization of a still higher recording density in the field of a magnetic recordation.

However, the increased number of GMR films in the aforementioned manner inevitably suffers from a deteriorated or lower linear recording density along the recording tracks. An expected improvement in the recording density cannot be achieved. Moreover, the CPP structure magnetoresistive head of the aforementioned type also suffers from difficulty in controlling the magnetic domain of the free ferromagnetic layer.

SUMMARY OF THE INVENTION

It is accordingly an object of the present invention to provide a CPP structure spin valve magnetoresistive transducer capable of achieving a larger variation in the electric resistance with fewer layers.

According to a first aspect of the present invention, there is provided a current perpendicular-to-the-plane (CPP) structure spin valve magnetoresistive (MR) transducer comprising: a free ferromagnetic layer; a non-magnetic spacer layer contacting the free ferromagnetic layer over a first interface; a pinned ferromagnetic layer contacting the non-magnetic spacer layer over a second interface; and an insulating layer spaced by the pinned ferromagnetic layer from the non-magnetic spacer layer.

In addition, according to a second aspect of the present invention, there is provided a current perpendicular-to-the-plane (CPP) structure spin valve magnetoresistive (MR) transducer comprising: a free ferromagnetic layer; a non-magnetic spacer layer contacting the free ferromagnetic layer over a first interface; a pinned ferromagnetic layer contacting the non-magnetic spacer layer over a second interface; and an insulating layer spaced by the free ferromagnetic layer from the non-magnetic spacer layer.

Any of the CPP structure spin valve MR transducers as described above enables the rotation of the magnetization in the free ferromagnetic layer in response to the reversal of the magnetic polarity applied from the outside. The rotation of the magnetization in the free ferromagnetic layer in this manner induces a larger variation in the electric resistance of the spin valve MR transducer. When a sensing current is allowed to flow in the vertical direction perpendicular to the first and/or second interfaces, a variation in voltage or the like appears in the sensing current, depending upon the variation in the electric resistance.

In this case, the sensing current is allowed to penetrate through the insulating layer in the CPP structure spin valve MR transducer. Fine pin-holes generally formed in the insulating layer are supposed to enable migration of electrons through the insulating layer. The sensing current thus concentrates at the individual pin-holes. Accordingly, similar to the situation in which the sensing current is allowed to flow through a reduced sectional area, a larger variation can be obtained in response to the inversion of the magnetization in the free ferromagnetic layer in the spin valve MR transducers of the above-described types. The CPP structure spin valve MR transducers are thus expected to greatly contribute to realization of a still higher recording density as well as a reduced consumption of the electricity. Moreover, the spin valve MR transducers of the above-described types are expected to exhibit an electric resistance approximately equal to a tenth part of that of a well-known tunnel junction magnetoresistive (TMR) element. Accordingly, a thermal noise can significantly be suppressed in the spin valve MR transducers as compared with the TMR element. It should be noted that the sensing current is only required to have at least a component flowing in the direction perpendicular to the first and/or second interfaces.

The insulating layer is only allowed to include a compound consisting of at least elements of two kinds. The compound may include an oxide, a nitride, a carbide, a boride, and the like. The insulating layer may be interposed between a pair of the pinned ferromagnetic layers or free ferromagnetic layers. Sputtering may be employed to form the insulating layer of the aforementioned compound. Alternatively, oxygen or nitrogen gas may be introduced to induce the reaction to the surface of the pinned and/or free ferromagnetic layers so as to establish the insulating layer spreading over the surface of the pinned and/or free ferromagnetic layers.

Furthermore, according to a third aspect of the present invention, there is provided a current perpendicular-to-the-plane (CPP) structure spin valve magnetoresistive (MR) transducer comprising: a free ferromagnetic layer; a non-magnetic spacer layer contacting the free ferromagnetic layer over a first interface; a pinned ferromagnetic layer contacting the non-magnetic spacer layer over a second interface; a first insulating layer spaced by the pinned ferromagnetic layer from the non-magnetic spacer layer; and a second insulating layer spaced by the free ferromagnetic layer from the non-magnetic spacer layer.

As mentioned above, the CPP structure spin valve MR transducer of this type allows a sensing current to concentrate at pin-holes formed in the insulating layer. Accordingly, similar to the situation in which the sensing current is allowed to flow through a reduced sectional area, a larger variation can be obtained in response to the inversion of the magnetization in the free ferromagnetic layer in the spin valve MR transducer. Moreover, the spin valve MR transducers of this type is expected to establish a specular reflection or diffusion between the first and second insulating layers. This leads to a still larger variation in the electric resistance in the spin valve MR transducer in response to the rotation of the magnetization in the free ferromagnetic layer.

It should be noted that the CPP structure spin valve MR transducers may be employed in any types of magnetic recording medium drive or storage device such as a hard disk drive.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
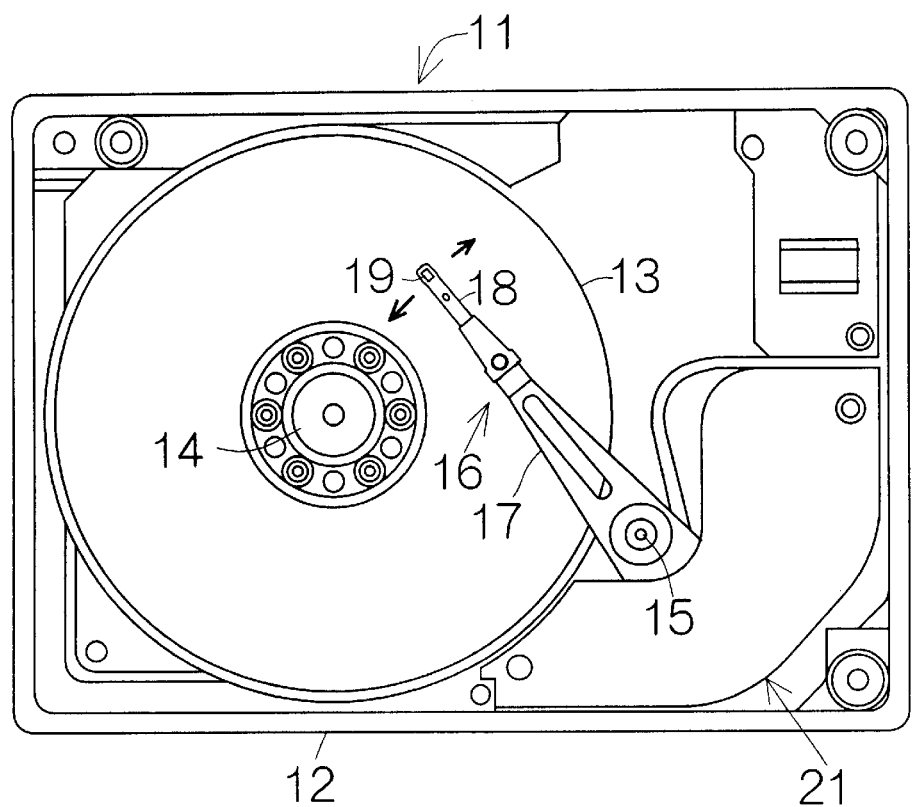
FIG. 1 is a plan view schematically illustrating the structure of a hard disk drive (HDD)

FIG. 1 schematically illustrates the interior structure of a hard disk drive (HDD) 11 as an example of a magnetic recording medium drive or storage device. The HDD 11 includes a box-shaped primary enclosure 12 defining an inner space of a flat parallelepiped, for example. At least one magnetic recording disk 13 is accommodated in the inner space within the primary enclosure 12. The magnetic recording disk 13 is mounted on a driving shaft of a spindle motor 14. The spindle motor 14 is allowed to drive the magnetic recording disk 13 for rotation at a higher revolution rate such as 7,200 rpm or 10,000 rpm, for example. A cover, not shown, is coupled to the primary enclosure 12 so as to define the closed inner space between the primary enclosure 12 and itself.

A carriage 16 is also accommodated in the inner space of the primary enclosure 12 for swinging movement about a vertical support shaft 15. The carriage 16 includes a rigid swinging arm 17 extending in the horizontal direction from the vertical support shaft 15, and an elastic head suspension 18 fixed to the tip end of the swinging arm 17 so as to extend forward from the swinging arm 17. As conventionally known, a flying head slider 19 is cantilevered at the head suspension 18 through a gimbal spring, not shown. The head suspension 18 serves to urge the flying head slider 19 toward the surface of the magnetic recording disk 13. When the magnetic recording disk 13 rotates, the flying head slider 19 is allowed to receive airflow generated along the rotating magnetic recording disk 13. The airflow serves to generate a lift on the flying head slider 19. The flying head slider 19 is thus allowed to keep flying above the surface of the magnetic recording disk 13 during rotation of the magnetic recording disk 13 at a higher stability established by the balance between the lift and the urging force of the head suspension 18.

When the carriage 16 is driven to swing about the support shaft 15 during flight of the flying head slider 19, the flying head slider 19 is allowed to cross the recording tracks defined on the magnetic recording disk 13 in the radial direction of the magnetic recording disk 13. This radial movement serves to position the flying head slider 19 right above a target recording track on the magnetic recording disk 13. In this case, an electromagnetic actuator 21 such as a voice coil motor (VCM) can be employed to realize the swinging movement of the carriage 16, for example. As conventionally known, in the case where two or more magnetic recording disks 13 are incorporated within the inner space of the primary enclosure 12, a pair of the elastic head suspensions 18 are mounted on a single common swinging arm 17 between the adjacent magnetic recording disks 13.

Figure 2:
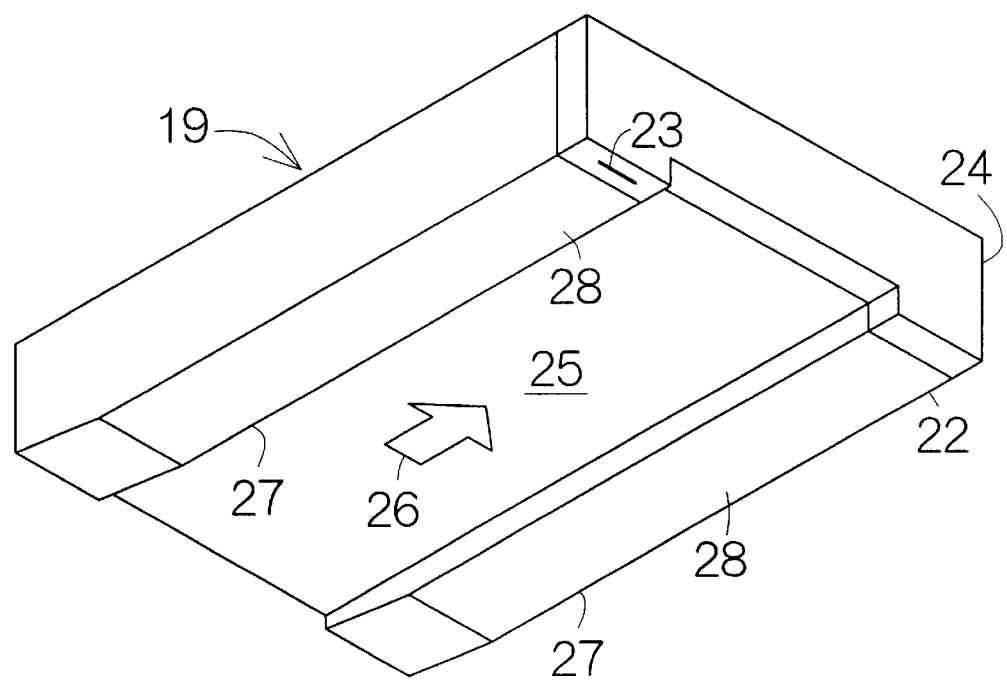
FIG. 2 is an enlarged perspective view schematically illustrating the structure of a flying head slider according to a specific example.

FIG. 2 illustrates a specific example of the flying head slider 19. The flying head slider 19 of this type includes a slider body 22 made from $Al_2O_3$-TiC in the form of a flat parallelepiped, and a head protection layer 24 formed to spread over the trailing or downstream end of the slider body 22. The head protection layer 24 may be made of $Al_2O_3$. A read/write electromagnetic transducer 23 is embedded in the head protection layer 24. A medium-opposed surface or bottom surface 25 is defined continuously over the slider body 22 and the head protection layer 24 so as to face the surface of the magnetic recording disk 13 at a distance. The bottom surface 25 is designed to receive airflow 26 generated along the surface of the rotating magnetic recording disk 13.

A pair of rails 27 are formed to extend over the bottom surface 25 from the leading or upstream end toward the trailing or downstream end. The individual rail 27 is designed to define an air bearing surface (ABS) 28 at its top surface. In particular, the airflow 26 generates the aforementioned lift at the respective air bearing surfaces 28. The read/write electromagnetic transducer 23 embedded in the head protection layer 24 is exposed at the air bearing surface 28 as described later in detail. The flying head slider 19 may take any shape or form other than the above-described one.

Figure 3:
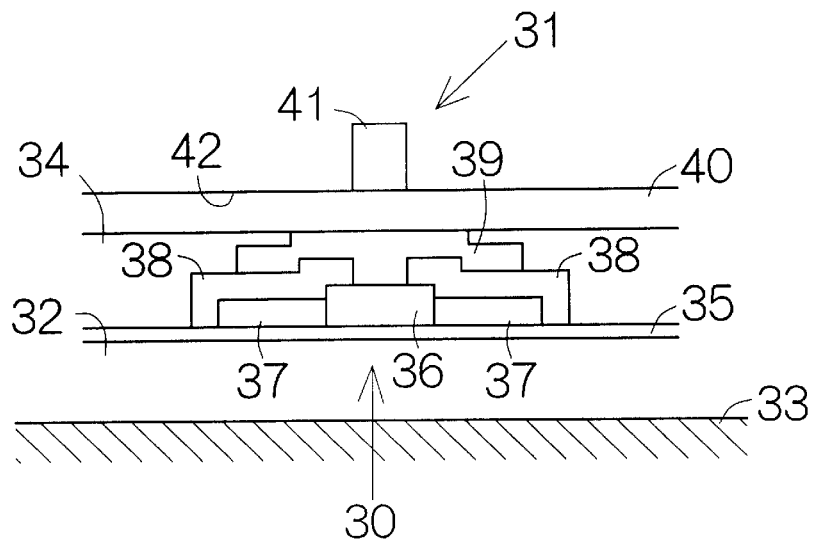
FIG. 3 is an enlarged front view of the flying head slider for illustrating a read/write electromagnetic transducer observed at the bottom surface.

FIG. 3 illustrates an enlarged detailed view of the read/write electromagnetic transducer 23 exposed at the bottom surface 25. The read/write electromagnetic transducer 23 includes a current perpendicular-to-the-plane (CPP) structure spin valve magnetoresistive (MR) element 30 for reading magnetic bit data out of the magnetic recording disk 13, and an inductive write element or a thin film magnetic head 31 for recording magnetic bit data into the magnetic recording disk 13. The spin valve MR element 30 is designed read the magnetic bit data by utilizing the electric resistance induced in response to a magnetic field acting from the magnetic recording disk 13. The thin film magnetic head 31 is designed to write the magnetic bit data by utilizing a magnetic field induced based on a conductive swirly coil pattern, not shown. The spin valve MR element 30 is located on the upper surface of a lower shield layer 32 made from a magnetic material such as FeN or NiFe, for example. The lower shield layer 32 is allowed to spread over the upper surface of an $Al_2O_3$ undercoat 33 serving as a lower half of the aforementioned head protection layer 24, for example. The spin valve MR element 30 is embedded within a non-magnetic layer 34, such as an $Al_2O_3$ layer, superposed over the upper surface of the lower shield layer 32.

The spin valve MR element 30 includes a lower terminal or lead layer 35 formed to extend over the surface of a fundamental layer, namely, the lower shield layer 32. The lower terminal layer 35 may be made from a conductive metallic material such as Au or Cu, for example. A spin valve film 36 is formed to extend on the upper surface of the lower terminal layer 35. The structure of the spin valve film 36 will be described later in detail.

The spin valve film 36 is interposed between a pair of domain control stripe layers 37 likewise extending over the surface of the fundamental or lower shield layer 32. The domain control stripe layers 37 may be made from CoCrPt, for example. As conventionally known, the domain control stripe layers 37 are designed to define the magnetization along the transverse direction across the spin valve film 36. The domain control stripe layers 37 thus serve to establish the single domain of a free ferromagnetic layer within the spin valve film 36. The spin valve film 36 and the domain control stripe layers 37 are embedded in an insulating layer 38 extending over the surface of the lower terminal layer 35. The insulating layer 38 may be made of an $Al_2O_3$ layer or $SiO_2$ layer, for example.

An upper shield layer 39 is formed to extend over the surface of the insulating layer 38. The upper shield layer 39 serves to interpose the spin valve film 36 between the lower shield layer 32 and itself. The upper shield layer 39 may be made from NiFe, for example. The upper shield layer 39 is designed to reach the upper surface of the spin valve film 36 through a gap defined in the insulating layer 38. Specifically, the upper shield layer 39 contacting the spin valve film 36 functions as an upper terminal or lead layer of the spin valve MR element 30. The upper shield layer 39 in combination with the lower terminal layer 35 serves to supply a sensing current to the spin valve film 36. In this case, the insulating layer 38 serves to isolate the upper shield layer 39 from the domain control stripe layers 37.

The above-described upper shield layer 39 still functions as a lower magnetic pole layer of the thin film magnetic head 31. Specifically, a non-magnetic gap layer 40 is formed to extend over the upper surface of the upper shield layer 39. The non-magnetic gap layer 40 may be made from $Al_2O_3$, for example. An upper magnetic pole layer 41 is formed to extend on the non-magnetic gap layer 40. The upper magnetic pole layer 41 is thus opposed to the upper shield layer 39 at a distance. The upper magnetic pole layer 41 may be made from NiFe, for example. As conventionally known, when a magnetic field is induced at the conductive swirly coil pattern, a magnetic flux is exchanged between the upper magnetic pole layer 41 and the upper shield layer 39. The non-magnetic gap layer 40 allows the exchanged magnetic flux to leak out of the bottom surface 25. The thus leaked magnetic flux forms a magnetic field for recordation, namely, a write gap magnetic field.

The upper magnetic pole layer 41 is covered with an $Al_2O_3$ overcoat 42 spreading over the upper surface of the non-magnetic gap layer 40. The $Al_2O_3$ overcoat 42 functions as an upper half of the aforementioned head protection layer 24. Specifically, a combination of the undercoat 33 and the overcoat 42 establishes the head protection layer 24.

Figure 4:
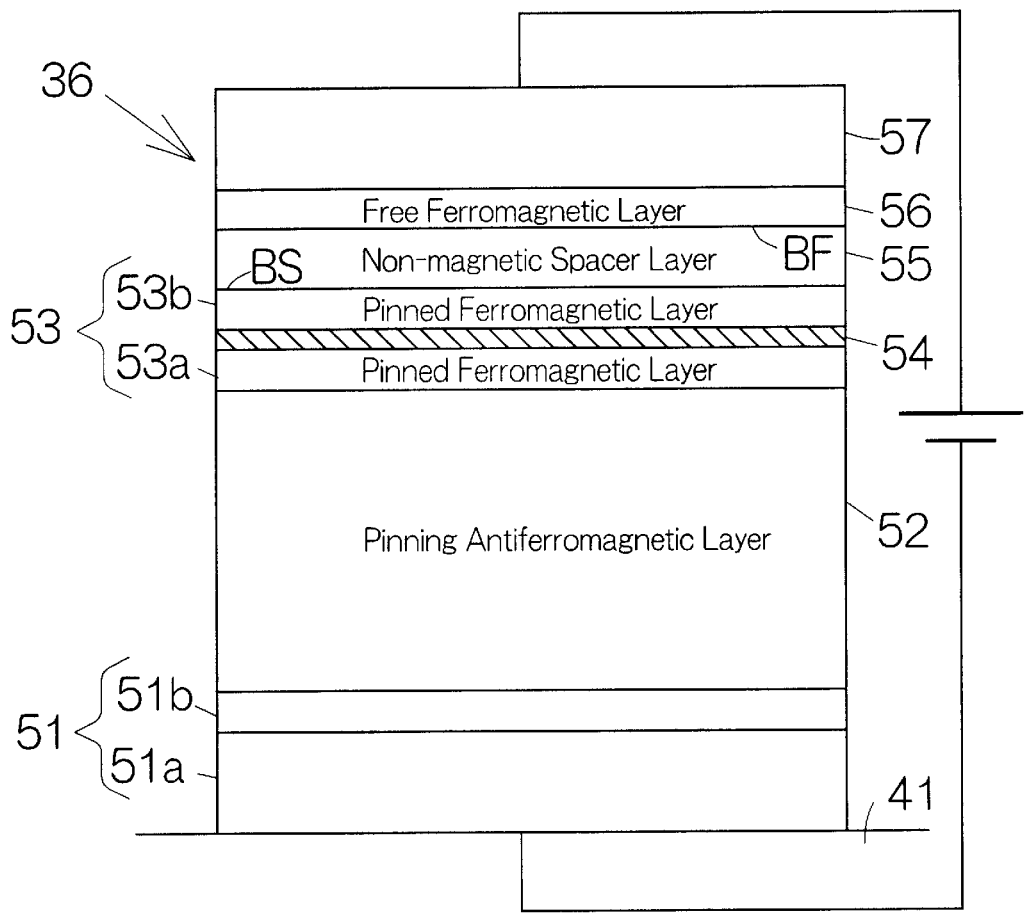
FIG. 4 is an enlarged partial sectional view of the flying head slider for schematically illustrating the structure of a spin valve film according to a first embodiment of the present invention.

Here, a detailed description will be made on the spin valve film 36 according to a first embodiment of the present invention. As shown in FIG. 4, the spin valve film 36 is a single spin valve film in which constitutive layers are stacked in a so-called reverse order. The spin valve film 36 includes abase layer 51 spreading over the surface of the lower terminal layer 35. The base layer 51 is designed to comprise a Ta layer 51a of approximately 5.0 nm thickness extending on the lower terminal layer 35, and an NiFe layer 51b of approximately 2.0 nm thickness extending over the surface of the Ta layer 51a. An antiferromagnetic layer 52, comprising a PdPtMn layer of approximately 15.0 nm thickness, as a pinning layer is formed to extend over the surface of the base layer 51.

A pinned ferromagnetic layer 53 is formed to extend over the surface of the antiferromagnetic layer 52. The pinned ferromagnetic layer 53 is designed to include a first ferromagnetic layer 53a extending over the antiferromagnetic layer 52, an insulating layer 54 received on the surface of the first ferromagnetic layer 52, and a second ferromagnetic layer 53b extending over the surface of the insulating layer 54. The insulating layer 54 is thus interposed between the first and second ferromagnetic layers 53a, 53b. The insulating layer 54 may be made of an oxide film resulting from the oxidation of the first ferromagnetic layer 53a, for example. The first and second ferromagnetic layer 53a, 53b may be made of a CoFeB layer of approximately 2.0 nm thickness, for example.

A non-magnetic spacer layer 55 is formed to extend on the surface of the pinned ferromagnetic layer 53. The non-magnetic spacer layer 55 may be made of a Cu layer of approximately 2.8 nm thickness, for example. A free ferromagnetic layer 56 is superposed on the surface of the non-magnetic spacer layer 55. The free ferromagnetic layer 56 may be made of a CoFeB layer of approximately 2.0 nm thickness, for example. A Ta layer 57 of approximately 5.0 nm thickness is superposed on the surface of the free ferromagnetic layer 56. A cap layer, not shown, may be formed on the surface of the Ta layer 57. The cap layer may include a Cu layer of approximately 10.0 nm thickness and an Au layer of approximately 10.0 nm thickness, for example.

A first planar boundary or interface BF is defined between the free ferromagnetic layer 56 and the non-magnetic spacer layer 55 in the spin valve film 36. Likewise, a second planar boundary or interface BS is defined between the pinned ferromagnetic layer 53 and the non-magnetic spacer layer 55. The second ferromagnetic layer 53b of the pinned ferromagnetic layer 53 thus serves to space or isolate the insulating layer 54 from the non-magnetic spacer layer 55.

When the spin valve MR element 30 is opposed to the surface of the magnetic recording disk 13, the magnetization of the free ferromagnetic layer 56 is allowed to rotate in the spin valve film 36 in response to the reversal of the magnetic polarity applied from the magnetic recording disk 13, as conventionally known. The rotation of the magnetization in the free ferromagnetic layer 56 induces variation in the electric resistance of the spin valve film 36. When a sensing current is supplied to the spin valve film 36 through the upper shield layer 39 and the lower terminal layer 35, a variation in voltage appears in the sensing current, for example. The variation in voltage can be utilized to detect magnetic bit data recorded on the magnetic recording disk 13.

Figure 5:
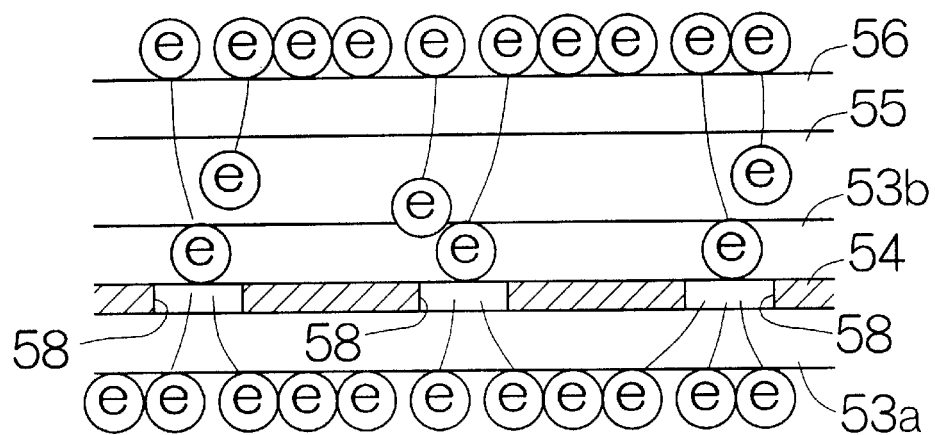
FIG. 5 is a schematic view illustrating the function of the insulating layer.

In this case, the sensing current is allowed to penetrate through the insulating layer 54 in the spin valve film 36 between the upper shield layer 39 and the lower terminal layer 35. The thin insulating layer 54 is in general supposed to suffer from some defection, namely, a plurality of fine pin-holes. As shown in FIG. 5, the fine pin-holes 58 are supposed to enable migration of electrons through the insulating layer 54. The sensing current thus concentrates at the individual pin-holes 58. Accordingly, similar to the situation in which the sensing current is allowed to flow through a reduced sectional area, a larger variation can be obtained in response to the inversion of the magnetization in the free ferromagnetic layer 56 in the spin valve MR element 30 of this type. A sufficient variation in voltage can be detected in response to supply of the sensing current of a smaller magnitude or lower level. The CPP structure spin valve MR element 30 is thus expected to greatly contribute to realization of a still higher recording density as well as a reduced consumption of the electricity. Moreover, the spin valve MR element 30 of this type is expected to exhibit an electric resistance approximately equal to a tenth part of that of a well-known tunnel junction magnetoresistive (TMR) element. Accordingly, a thermal noise can significantly be suppressed in the spin valve MR element 30 as compared with the TMR element. Furthermore, the domain control stripe layers 37 interposing the spin valve film 36 serve to reliably control or manage the magnetic domain of the free ferromagnetic layer 56.

Figure 6:
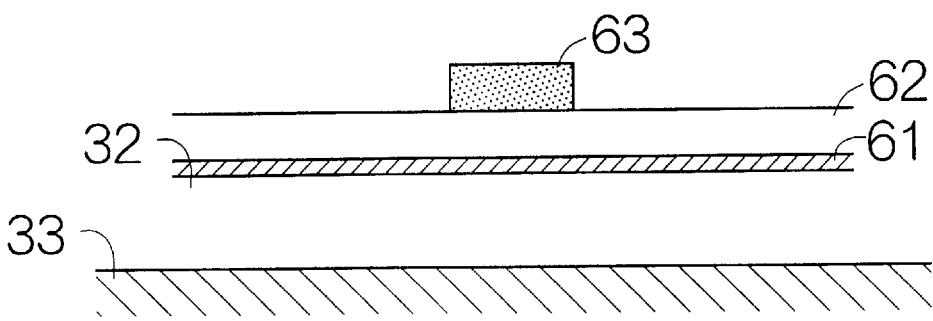
FIG. 6 is a partial sectional view illustrating a process of making the spin valve MR element.

Next, a brief description will be made on a method of making the spin valve MR element 30. As conventionally known, an $Al_2O_3$-TiC wafer, not shown, is first prepared, for example. The $Al_2O_3$ undercoat 33 is formed to cover over the surface of the $Al_2O_3$-TiC wafer. The lower shield layer 32 is then formed on the $Al_2O_3$ undercoat 33. An Au film 61 of approximately 10.0 nm thickness is subsequently formed on the surface of the lower shield layer 32, namely, the fundamental layer, as shown in FIG. 6. Sputtering may be employed to form the Au film 61, for example. The Au film 61 is designed to have a shape for establishing the lower terminal layer 35. A first layered material 62 having the layered structure identical to that of the aforementioned spin valve film 36 is then formed over the surface of the Au film 61. A detailed description will later be made on the formation of the first layered material 62.

Figure 7:
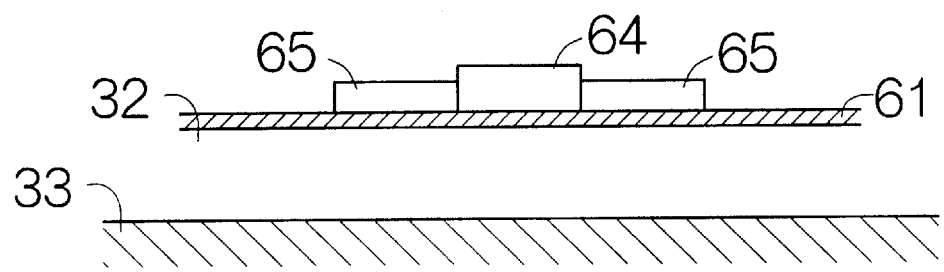
FIG. 7 is a partial sectional view illustrating a process of making the spin valve MR element.

As shown in FIG. 6, a photoresist film 63 is then formed on the first layered material 62. The photoresist film 63 is designed to have a predetermined planar shape. Ion milling, for example, is then employed to remove the first layered material 63 in an area adjacent the photoresist film 63. As shown in FIG. 7, a second layered material 64 of the predetermined shape is thus formed out of the first layered material 62. CoCrPt layers 65 are then formed over the Au film 61 so as to interpose the second layered material 64 on the surface of the Au film 61. The photoresist film 63 may be removed after the formation of the CoCrPt layer 65 has been completed. The second layered material 64 and the CoCrPt layer 65 of a predetermined shape is thereafter scraped into a stripe material 66 extending along a straight line crossing the second layered material 64, as conventionally known.

Figure 8:
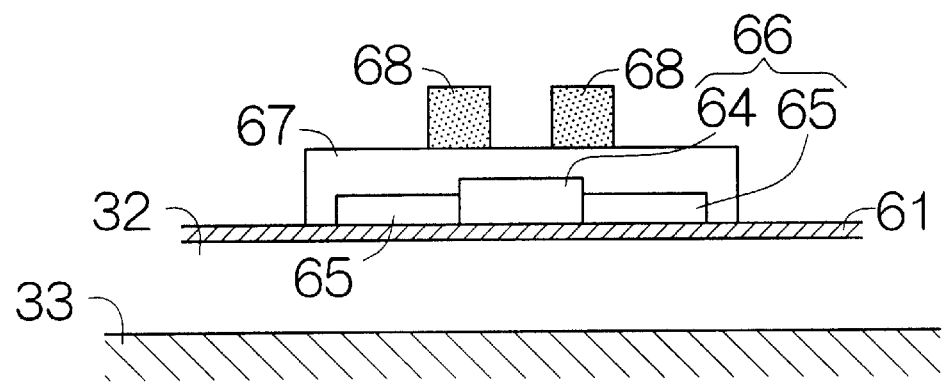
FIG. 8 is a partial sectional view illustrating a process of making the spin valve MR element.
Figure 9:
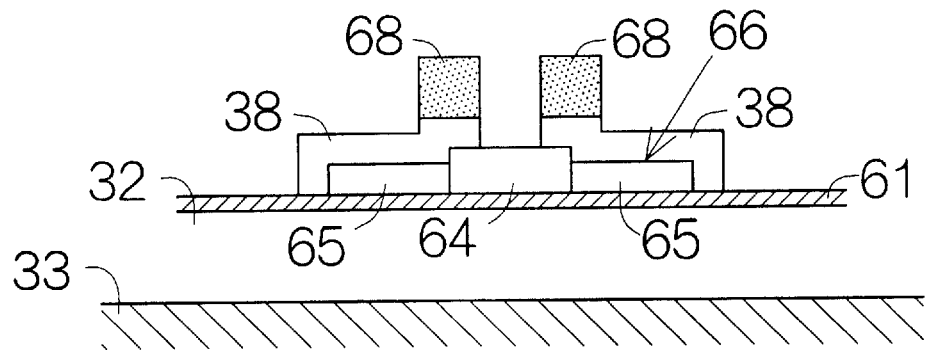
FIG. 9 is a partial sectional view illustrating a process of making the spin valve MR element.

As shown in FIG. 8, an insulating material film 67 is then formed on the Au film 61. The insulating material film 67 is allowed to completely cover over the stripe material 66. A photoresist film 68 is formed on the insulating material film 67. Reactive ion etching (RIE), for example, is then employed to remove the insulating material film 67 in an area adjacent the photoresist film 68. As shown in FIG. 9, the insulating layer 38 is scraped out of the insulating material film 67 in this manner. The second material layer 64 in the stripe material 66 is allowed to expose, at least partially, at a gap defined in the insulating material film 67, namely, the insulating layer 38. The photoresist film 68 is thereafter removed.

Figure 10:
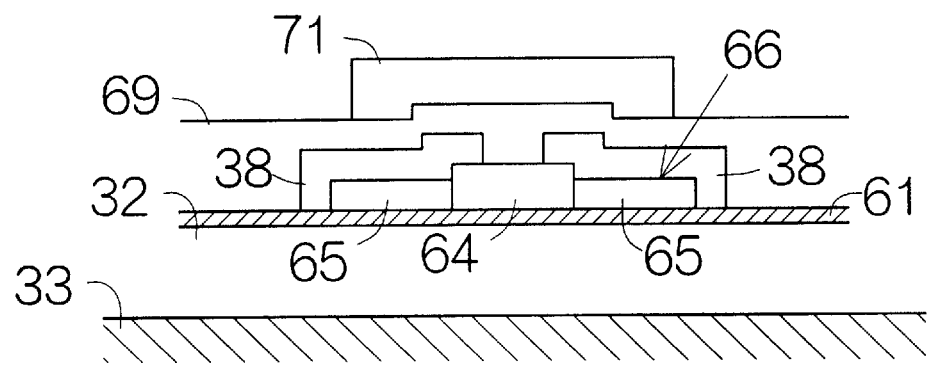
FIG. 10 is a partial sectional view illustrating a process of making the spin valve MR element.
Figure 11:
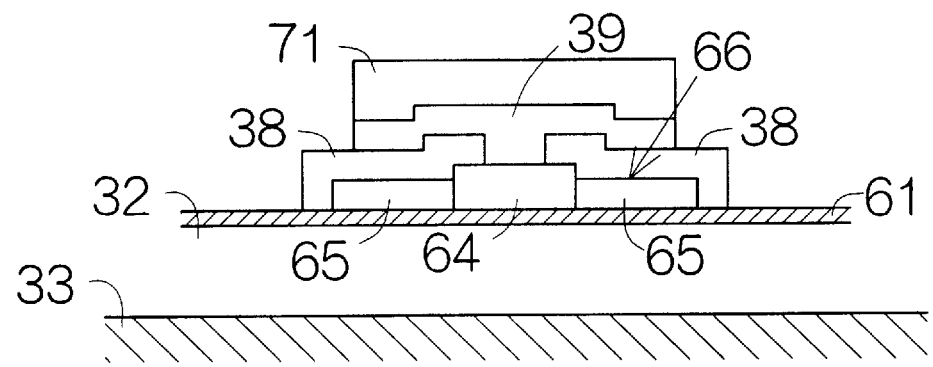
FIG. 11 is a partial sectional view illustrating a process of making the spin valve MR element.

As shown in FIG. 10, an NiFe film 69 is still formed on the insulating layer 38. Sputtering may be employed to form the NiFe film 69, for example. A photoresist film 71 is formed on the surface of the NiFe film 69. The photoresist film 71 is designed to have the planar shape of the aforementioned upper shield layer 39. RIE is then effected to remove the NiFe film 69 in an area adjacent the photoresist film 71, for example, as shown in FIG. 11. The upper shield layer 39 is scraped out of the NiFe film 69 in this manner. The photoresist film 71 is thereafter removed.

When the lower terminal layer 35, the spin valve film 36, the domain control stripe layers 37, the insulating layer 38 and the upper shield layer 39 have been formed in the above-mentioned manner, the $Al_2O_3$ non-magnetic layer 34 is formed on the lower shield layer 32. The lower terminal layer 35, the spin valve film 36, the domain control stripe layers 37, the insulating layer 38 and the upper shield layer 39 are thus embedded in the non-magnetic layer 34, as is apparent from FIG. 3, for example. As conventionally known, the non-magnetic gap layer 40 as well as the upper magnetic pole layer 41 of the thin film magnetic head 31 are sequentially formed on the non-magnetic layer 34. Flattening polishing treatment may be effected on the non-magnetic layer 34 prior to the formation of the non-magnetic gap layer 40 and the upper magnetic pole layer 41. The flattening polishing treatment may serve to expose the upper shield layer 39 at a gap defined in the non-magnetic layer 34.

Figure 12:
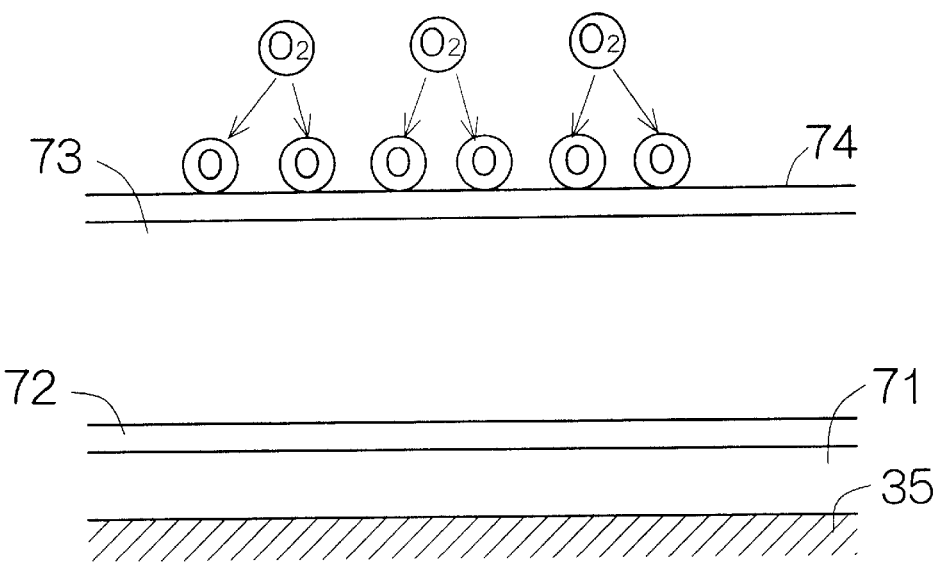
FIG. 12 is an enlarged partial sectional view illustrating a process of forming the insulating layer in the spin valve film.

Next, a brief description will be made on the formation of the first layered material 62. As shown in FIG. 12, a Ta layer 71 of approximately 5.0 nm thickness, an NiFe layer 72 of approximately 2.0 nm thickness, a PdPtMn layer 73 of approximately 15.0 nm thickness and a CoFeB layer 74 of approximately 2.0 nm thickness are sequentially formed on the surface of the lower terminal layer 35. Sputtering may be effected in a vacuum chamber so as to form these layers 71–74, for example. Oxygen gas is introduced into the chamber after the formation of the CoFeB layer 74, for example. The oxygen gas causes the oxidation of the surface of the CoFeB layer 74. The oxidation serves to establish an oxide film spreading over the surface of the CoFeB layer 74. A CoFeB layer of approximately 2.0 nm thickness, a Cu layer of approximately 2.8 nm thickness, a CoFeB layer of approximately 2.0 nm thickness and a Ta layer of approximately 10.0 nm thickness are thereafter formed on the oxide film in this sequence. Still, a Cu layer of approximately 10.0 nm thickness as well as an Au layer of approximately 10.0 nm thickness may sequentially be formed on the surface of the Ta layer.

As described above, the spin valve MR element 30 can be formed with a conventional method except the simple introduction of oxygen gas into a vacuum chamber during formation of the insulating layer 54 in the spin valve film 36. The formation of the insulating layer 54 can be achieved in a relatively facilitated manner based on the utilization of a conventional method. Existing instruments or apparatuses can be employed in the method. It should be noted that oxygen plasma may take the place of a simple introduction of the oxygen gas in the above-described method.

Figure 13:
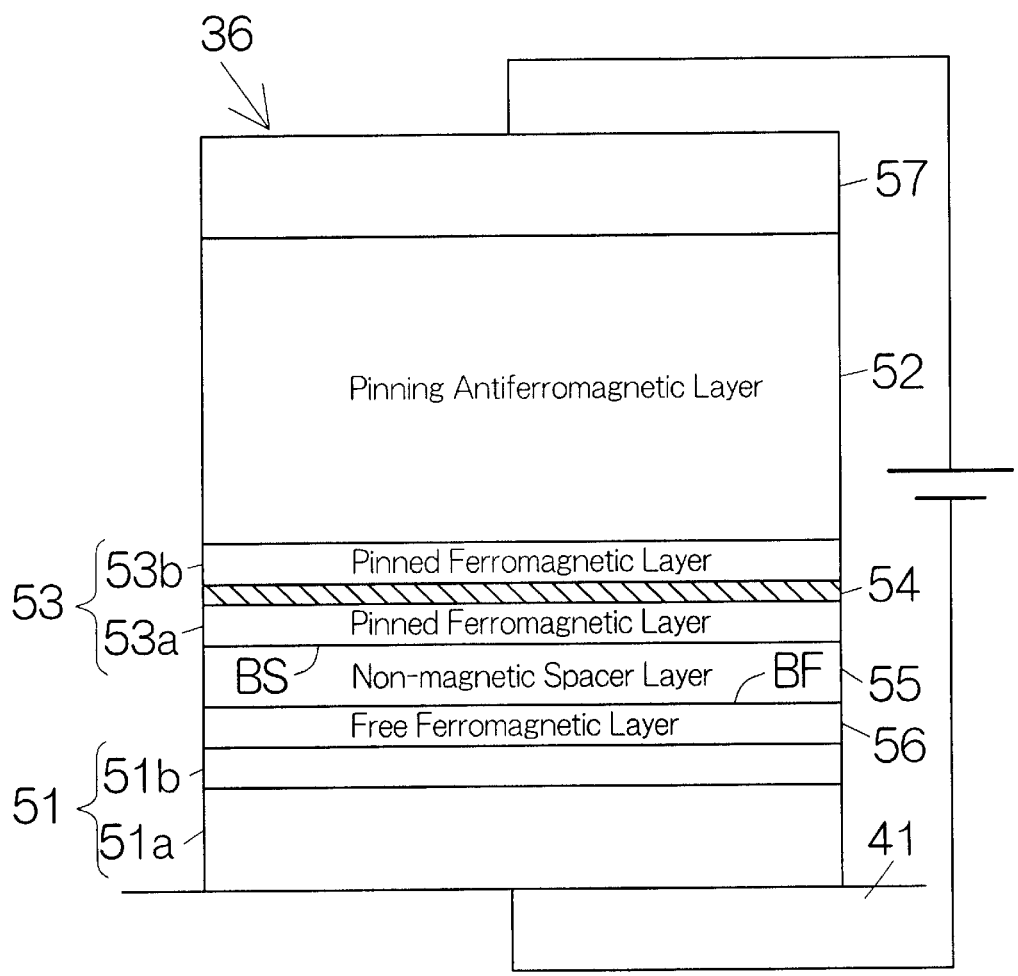
FIG. 13 is an enlarged partial sectional view of the flying head slider for schematically illustrating the structure of a spin valve film according to a modified example of the first embodiment.

Alternatively, the spin valve film 36 may be a single spin valve film in which constitutive layers are stacked in a so-called normal or right order, as shown in FIG. 13, for example. Specifically, the free ferromagnetic layer 56, the non-magnetic spacer layer 55, the pinned ferromagnetic layer 53, the antiferromagnetic layer 52 and the Ta layer 57 are sequentially formed on the base layer 51 in this spin valve film 36. A first planar boundary or interface BF is defined between the free ferromagnetic layer 56 and the non-magnetic spacer layer 55, while a second planar boundary or interface BS is defined between the pinned ferromagnetic layer 53 and the non-magnetic spacer layer 55. The insulating layer 54 is interposed between the first and second ferromagnetic layers 53a, 53b in the pinned ferromagnetic layer 53. The first ferromagnetic layer 53a thus serves to space or isolate the insulating layer 54 from the non-magnetic spacer layer 55. The insulating layer 54 may be an oxide film established on the surface of the first ferromagnetic layer 53a in the aforementioned manner.

Figure 14:
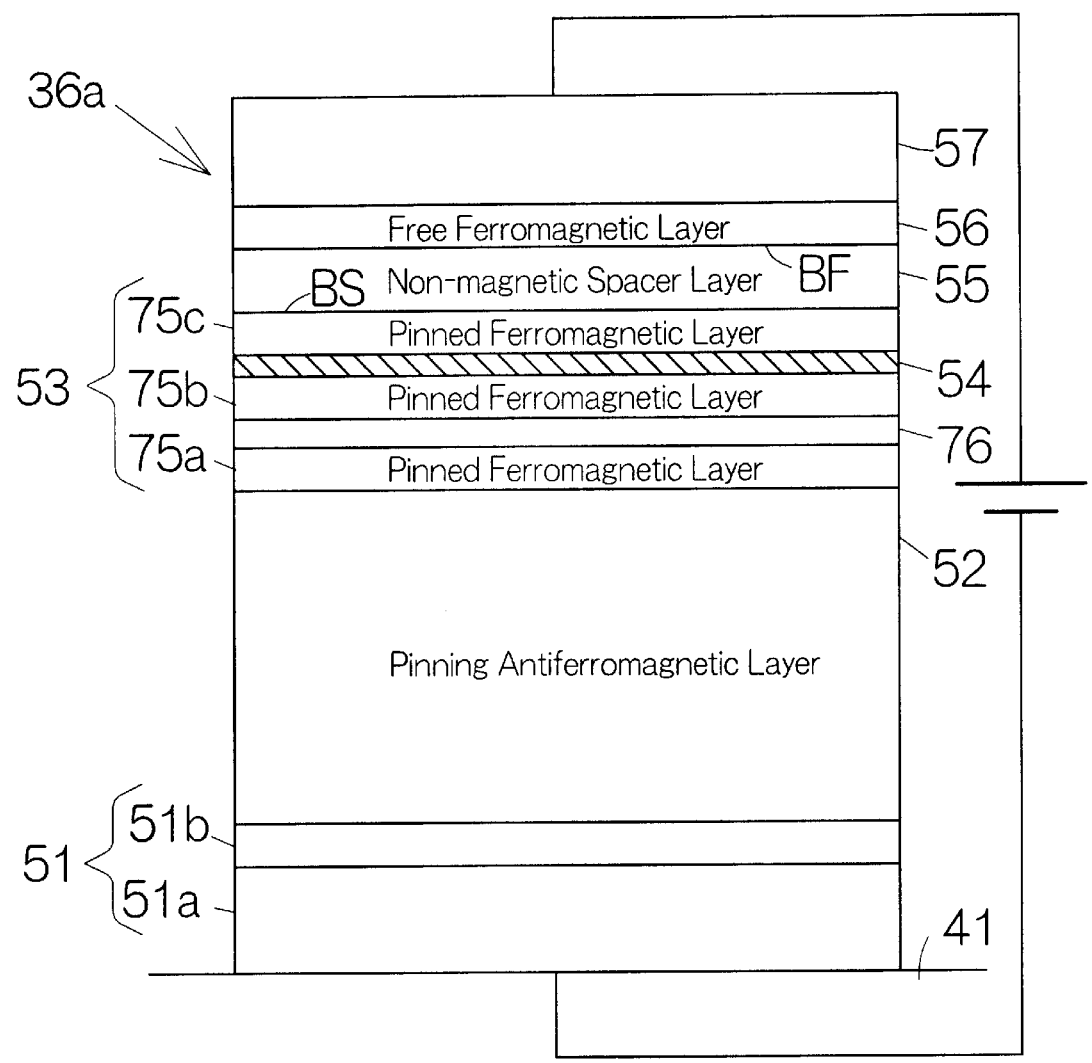
FIG. 14 is an enlarged partial sectional view of the flying head slider for schematically illustrating the structure of a spin valve film according to a second embodiment of the present invention.

FIG. 14 illustrates the spin valve film 36a according to a second embodiment of the present invention. The spin valve film 36a of this embodiment employs a layered ferrimagnetic structure film as the pinned ferromagnetic layer 53. The layered ferrimagnetic structure film includes a first ferromagnetic layer 75a formed to extend over the antiferromagnetic layer 52, an Ru layer 76 of approximately 0.8 nm thickness spreading over the first ferromagnetic layer 75a, and a second ferromagnetic layer 75b spreading over the Ru layer 76. The Ru layer 76 is thus interposed between the first and second ferromagnetic layers 75a, 75b. The insulating layer 54 is formed to extend over the second ferromagnetic layer 75b in the aforementioned manner. A third ferromagnetic layer 75c is superposed over the surface of the insulating layer 54. The third ferromagnetic layer 75c accordingly serves to space or isolate the insulating layer 54 from the non-magnetic spacer layer 55. In this case, the ferromagnetic layer 75a, 75b, 75c may be a CoFeB layer of approximately 2.0 nm thickness, for example. As well known, the layered ferrimagnetic structure film is allowed to establish a stronger fixation or pinning of the magnetization in the pinned ferromagnetic layer 53, so that a still larger variation in the electric resistance can be accomplished in the spin valve film 36a as compared with the aforementioned spin valve film 36. It should be noted that like reference numerals are attached to the structures or components identical or equivalent to those of the aforementioned embodiment.

Figure 15:
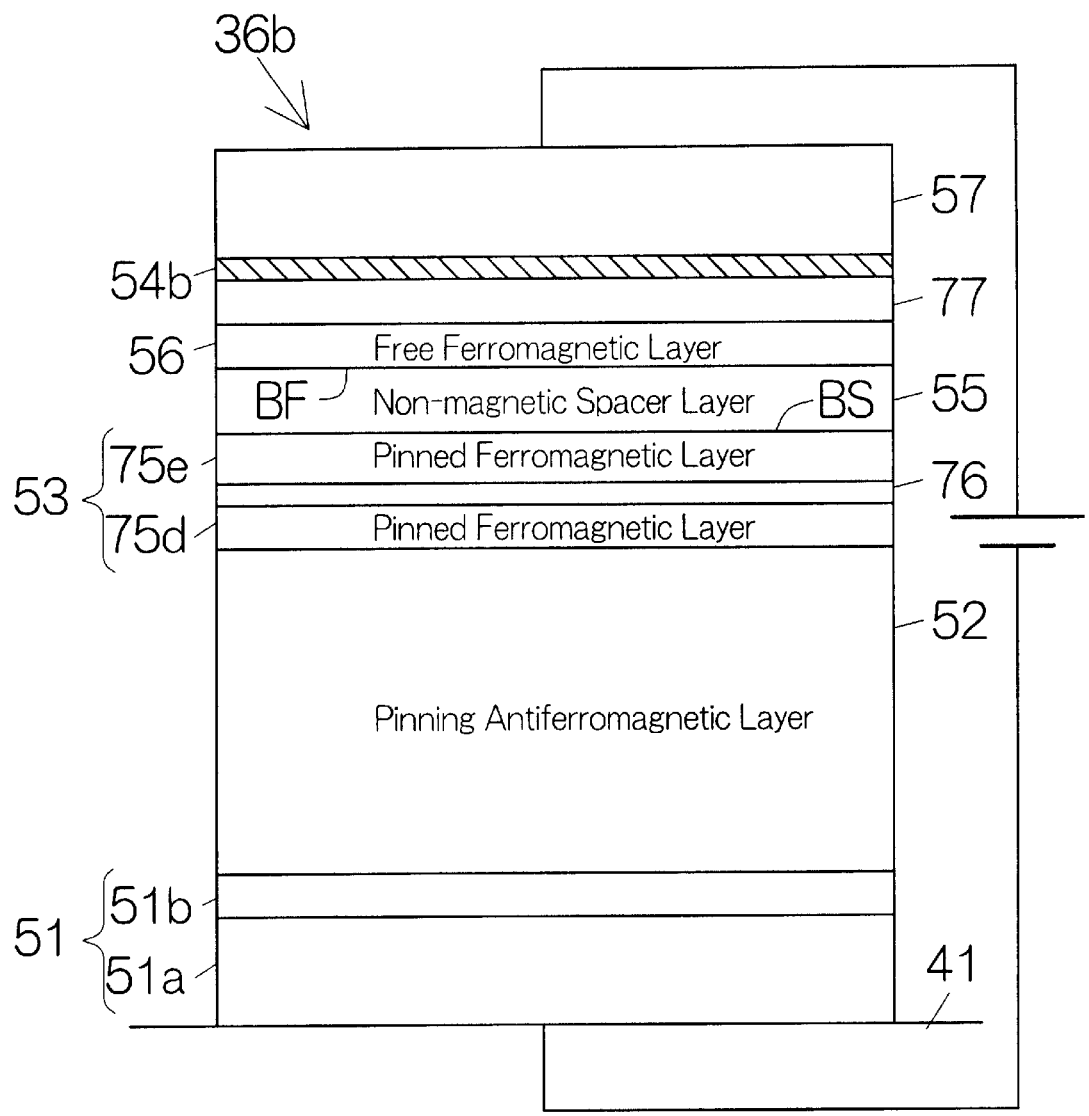
FIG. 15 is an enlarged partial sectional view of the flying head slider for schematically illustrating the structure of a spin valve film according to a third embodiment of the present invention.

FIG. 15 illustrates the spin valve film 36b according to a third embodiment of the present invention. The spin valve film 36b of this type is designed to include the insulating layer 54b interposed between the free ferromagnetic layer 56 and the Ta layer 57. The insulating layer 54b may be an oxide film, for example, in the aforementioned manner. In this case, the free ferromagnetic layer 56 serves to space or isolate the insulating layer 54b from the non-magnetic spacer layer 55. The thickness of the free ferromagnetic layer 56 may be set at approximately 2.0 nm, for example. Similar to the aforementioned spin valve films 36, 36a, the spin valve film 36b is allowed to exhibit a larger variation in the electric resistance in response to the rotation of the magnetization in the free ferromagnetic layer 56.

The oxide film may be a layered lamination, comprising $Fe_2O_3$ and $Al_2O_3$ layers, of approximately 2.0 nm overall thickness formed over the surface of the free ferromagnetic layer 56, for example. Sputtering may be employed to form the layered lamination. Alternatively, the introduction of oxygen gas into a vacuum chamber after formation of the free ferromagnetic layer 56 as described above may be employed to form the oxide film. Oxygen plasma may be employed in place of the simple introduction of the oxygen gas. The oxygen gas and plasma serve to cause oxidation reaction at the surface of the free ferromagnetic layer 56. The oxidation serves to establish the oxide film spreading over the surface of the free ferromagnetic layer 56. In these cases, a seed layer such as a Cu layer of approximately 2.0 nm thickness and a Ta layer of approximately 1.0 nm thickness in combination, for example, may be formed on the free ferromagnetic layer 56 prior to the introduction of the oxygen gas or oxygen plasma.

The spin valve film 36b of the third embodiment utilizes a layered ferrimagnetic structure film as the pinned ferromagnetic layer 53 in the same manner as the aforementioned spin valve 36a. The layered ferrimagnetic structure film includes a first ferromagnetic layer 75d spreading over the antiferromagnetic layer 52, an Ru layer 76 of approximately 0.8 nm thickness spreading over the first ferromagnetic layer 75d, and a second ferromagnetic layer 75e spreading over the Ru layer 76. The Ru layer 76 is thus interposed between the first and second ferromagnetic layers 75d, 75e. The first ferromagnetic layer 75d may be a CoFeB layer of approximately 2.0 nm thickness, for example. The second ferromagnetic layer 75e may be a CoFeB layer of approximately 2.5 nm thickness. As well known, the layered ferrimagnetic structure film is allowed to establish a stronger fixation or pinning of the magnetization in the pinned ferromagnetic layer 53, so that a still larger variation in the electric resistance can be accomplished in the spin valve film 36a, as compared with the case where a single CoFeB layer is simply employed as the pinned ferromagnetic layer 53. However, any other magnetic material can be employed as the pinned ferromagnetic layer 53. It should be noted that like reference numerals are attached to the structures or components identical or equivalent to those of the aforementioned embodiments.

Figure 16:
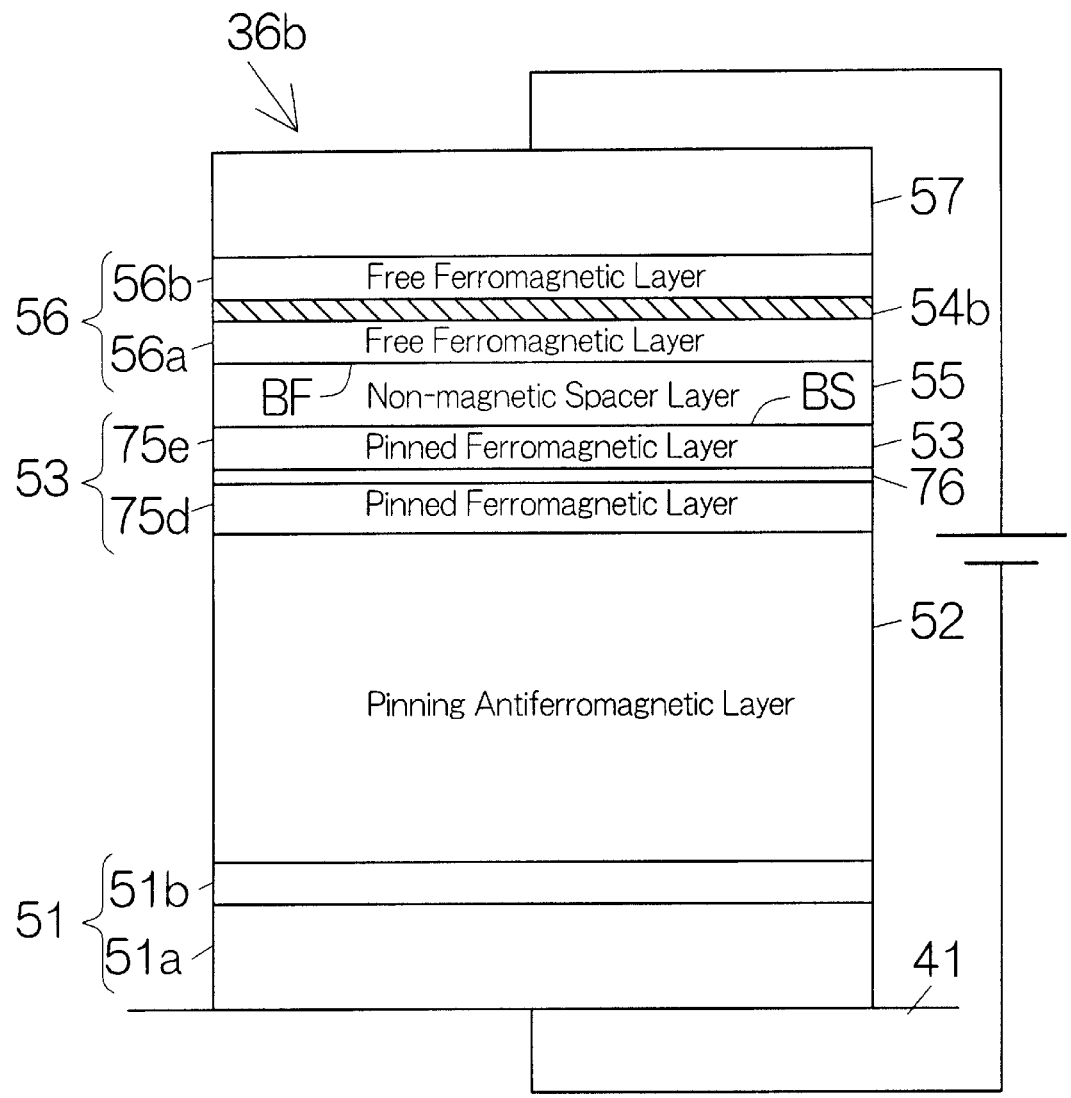
FIG. 16 is an enlarged partial sectional view of the flying head slider for schematically illustrating the structure of a spin valve film according to a modified example of the third embodiment.

As is apparent from FIG. 15, a Cu layer 77 as a spacer or break layer may be interposed between the free ferromagnetic layer 56 and the insulating layer 54b in the spin valve film 36b of the third embodiment. The Cu layer 77 serves to reduce the coercive force Hc of the free ferromagnetic layer 56. Also, the insulating layer 54b may be formed within the free ferromagnetic layer 56, as shown in FIG. 16, for example. The insulating layer 54b may be an oxide film interposed between the first and second ferromagnetic layers 56a, 56b, for example. In this case, the first ferromagnetic layer 56a serves to space or isolate the insulating layer 54b from the non-magnetic spacer layer 55. The first and second ferromagnetic layers 56a, 56b may be allowed to have the thickness set at approximately 2.0 nm, respectively. The thickness of the pinned ferromagnetic layer 53 may be set at approximately 2.0 nm.

Figure 17:
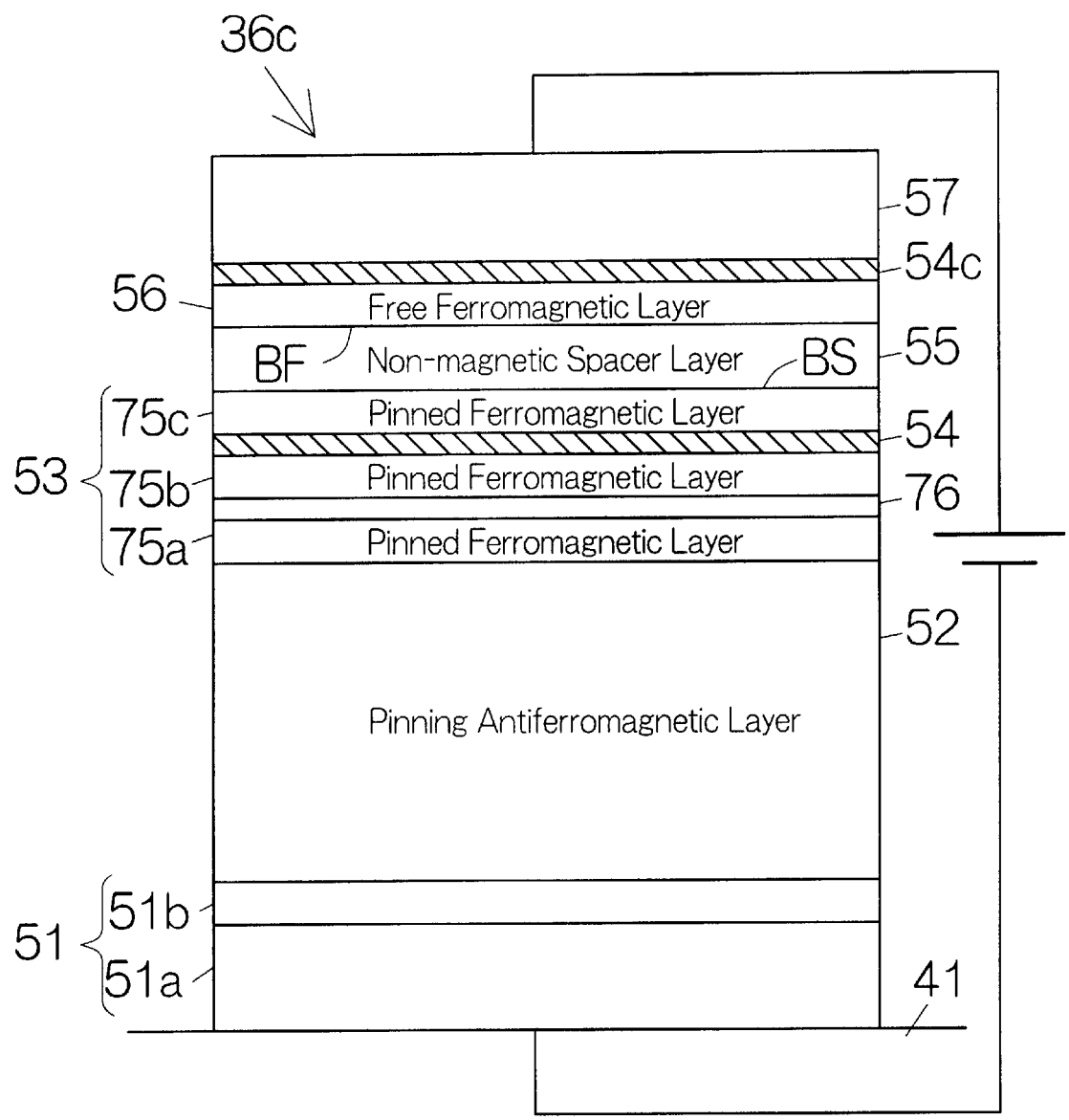
FIG. 17 is an enlarged partial sectional view of the flying head slider for schematically illustrating the structure of a spin valve film according to a fourth embodiment of the present invention.

FIG. 17 illustrates the spin valve film 36c according to a fourth embodiment of the present invention. The spin valve film 36c is designed to include an insulating layer 54c interposed between the free ferromagnetic layer 56 and the Ta layer 57, in addition to the insulating layer 54 incorporated within the pinned ferromagnetic layer 53 as described above. The third ferromagnetic layer 75c of the pinned ferromagnetic layer 53 thus serves to space or isolate the insulating layer 54 from the non-magnetic spacer layer 55. At the same time, the free ferromagnetic layer 56 also serves to space or isolate the insulating layer 54c from the non-magnetic spacer layer 55. Similar to the aforementioned spin valve films 36, 36a, 36b, the spin valve film 36c is allowed to exhibit a larger variation in the electric resistance in response to the rotation of the magnetization in the free ferromagnetic layer 56. It should be noted that like reference numerals are attached to the structures or components identical or equivalent to those of the aforementioned embodiments. In addition, any magnetic material other than the layered ferrimagnetic structure film can be employed as the pinned ferromagnetic layer 53.

The insulating layer 54c may be a layered lamination, comprising $Fe_2O_3$ and $Al_2O_3$ layers, of approximately 2.0 nm overall thickness formed over the surface of the free ferromagnetic layer 56, for example. Sputtering may be employed to form the layered lamination. Alternatively, the introduction of oxygen gas into a vacuum chamber after formation of the free ferromagnetic layer 56 as described above may be employed to form the oxide film. Oxygen plasma may be employed in place of the simple introduction of the oxygen gas. The oxygen gas and plasma serve to cause oxidation reaction at the surface of the free ferromagnetic layer 56. The oxidation serves to establish the oxide film spreading over the surface of the free ferromagnetic layer 56. In these cases, a seed layer such as a Cu layer of approximately 2.0 nm thickness and a Ta layer of approximately 1.0 nm thickness in combination, for example, may be formed on the free ferromagnetic layer 56 prior to the introduction of the oxygen gas or oxygen plasma.

Figure 18:
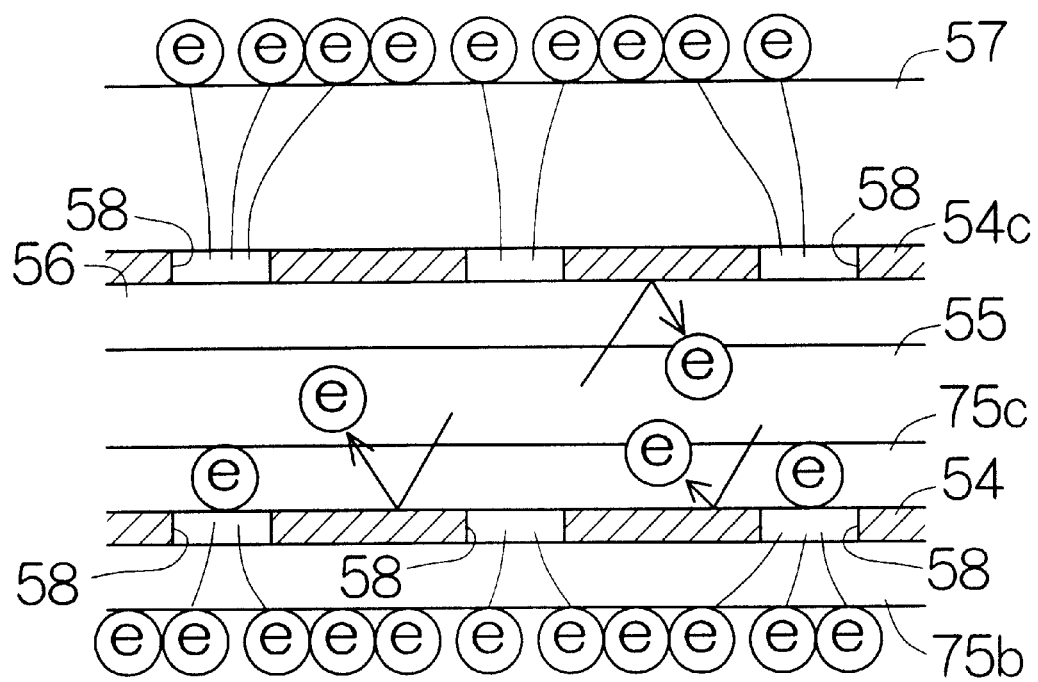
FIG. 18 is a schematic view illustrating the principle of the specular reflection in the spin valve film.
Figure 19:
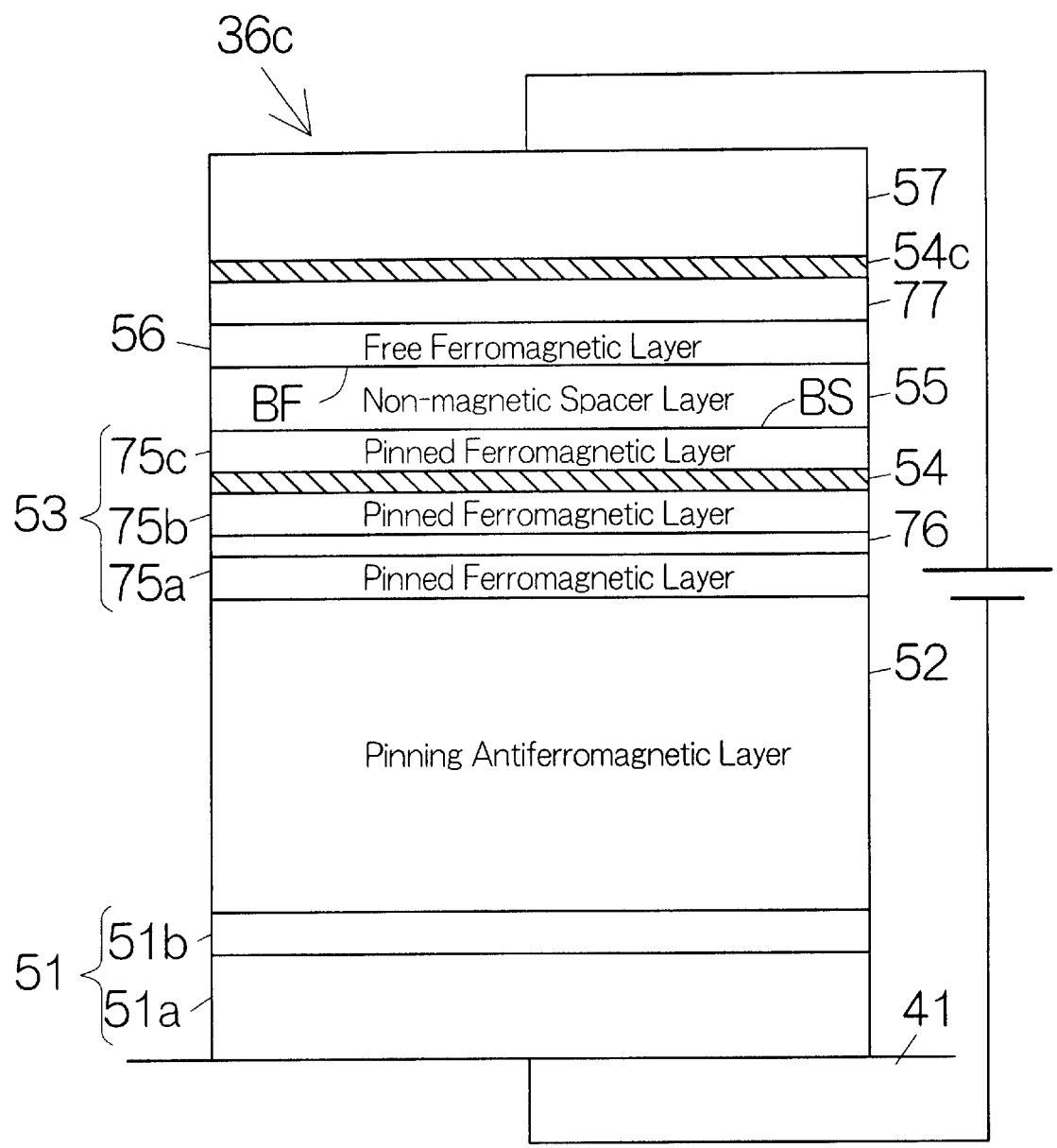
FIG. 19 is an enlarged partial sectional view of the flying head slider for schematically illustrating the structure of a spin valve film according to a modified example of the fourth embodiment.

In particular, the spin valve film 36c of this type is supposed to enable the specular reflection or diffusion of electrons between the insulating layers 54, 54b, as shown in FIG. 18, for example. This leads to a still larger variation in the electric resistance in the spin valve film 36c in response to the rotation of the magnetization in the free ferromagnetic layer 56. It should be noted that the aforementioned spacer Cu layer 77 may be interposed between the free ferromagnetic layer 56 and the insulating layer 54c in this fourth embodiment, as shown in FIG. 19, for example.

Figure 20:
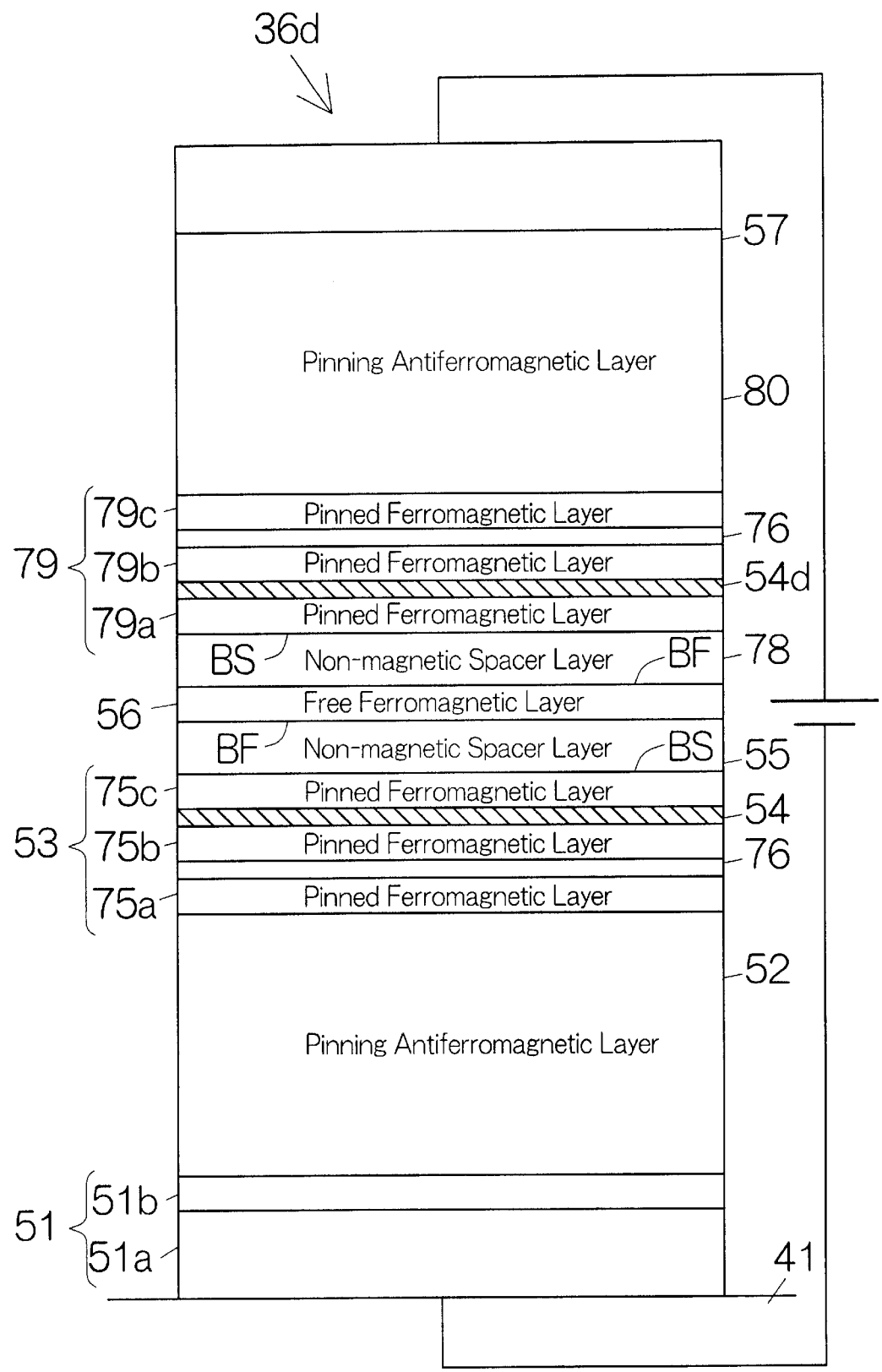
FIG. 20 is an enlarged partial sectional view of the flying head slider for schematically illustrating the structure of a spin valve film according to a fifth embodiment of the present invention.

FIG. 20 illustrates the spin valve film 36d according to a fifth embodiment of the present invention. The spin valve film 36d is a so-called dual spin valve film. Specifically, the spin valve film 36d is designed to include the base layer 51, the antiferromagnetic layer 52, the pinned ferromagnetic layer 53 interposing the insulating layer 54, the non-magnetic spacer layer 55 and the free ferromagnetic layer 56 stacked in this sequence in the aforementioned manner. The third ferromagnetic layer 75c of the pinned ferromagnetic layer 53 thus serves to space or isolate the insulating layer 54 from the non-magnetic spacer layer 55.

In addition, a non-magnetic spacer layer 78, a pinned ferromagnetic layer 79, an antiferromagnetic layer 80 and the Ta layer 57 are sequentially stacked on the free ferromagnetic layer 56. A first planar boundary or interface BF is defined between the free ferromagnetic layer 56 and the non-magnetic spacer layer 78, while a second planar boundary or interface BS is defined between the pinned ferromagnetic layer 79 and the non-magnetic spacer layer 78. Like reference numerals are attached to the structures or components identical or equivalent to those of the aforementioned embodiments.

The spin valve film 36d of the fifth embodiment is designed to employ a layered ferrimagnetic structure film as the pinned ferromagnetic layer 79 in the aforementioned manner. The layered ferrimagnetic structure film includes a first ferromagnetic layer 79a spreading over the non-magnetic spacer layer 78 so as to receive an insulating layer 54d at the surface, and a second ferromagnetic layer 79b spreading over the insulating layer 54d. The insulating layer 54d is thus interposed between the first and second ferromagnetic layers 79a, 79b. The first ferromagnetic layer 79a of the pinned ferromagnetic layer 79 accordingly serves to space or isolate the insulating layer 54d from the non-magnetic spacer layer 78. In this case, the insulating layer 54d may be an oxide film resulting from the oxidation of the first ferromagnetic layer 79a, for example. The Ru layer 76 of approximately 0.8 nm thickness is superposed on the surface of the second ferromagnetic layer 79b. Still, a third ferromagnetic layer 79c is superposed on the surface of the Ru layer 76. The ferromagnetic layers 79a, 79b, 79c may be made of a CoFeB layer of approximately 2.0 nm thickness, for example, respectively. The non-magnetic spacer layer 78 and the antiferromagnetic layer 80 are allowed to have the structure identical to those of the aforementioned non-magnetic spacer layer 55 and antiferromagnetic layer 52, respectively.

Similar to the aforementioned spin valve films 36, 36a, 36b, 36c, the spin valve film 36d is allowed to exhibit a larger variation in the electric resistance in response to the rotation of the magnetization in the free ferromagnetic layer 56. However, any magnetic material other than the layered ferrimagnetic structure film can be employed as the pinned ferromagnetic layer 53, 79.

Figure 21:
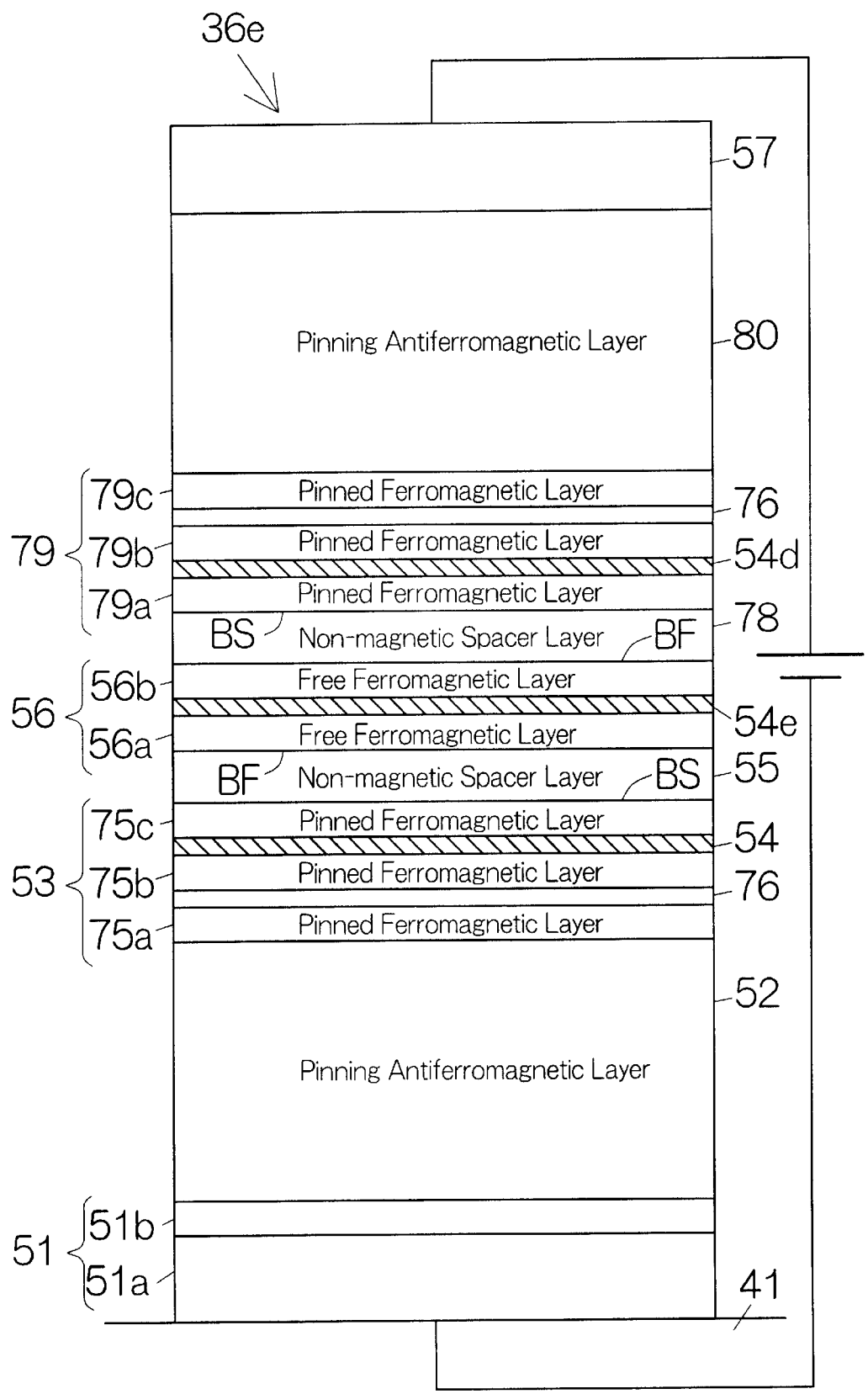
FIG. 21 is an enlarged partial sectional view of the flying head slider for schematically illustrating the structure of a spin valve film according to a sixth embodiment of the present invention.

FIG. 21 illustrates the spin valve film 36e according to a sixth embodiment of the present invention. The spin valve film 36e is designed to have the structure similar to the aforementioned fifth embodiment except an insulating layer 54e embedded within the free ferromagnetic layer 56. The insulating layer 54e may be an oxide film, for example. In this case, the individual ferromagnetic layers 56a, 56b serve to space or isolate the insulating layer 54e from the non-magnetic spacer layers 55, 78, respectively. The ferromagnetic layers 56a, 56b may be allowed to have the thickness set at approximately 2.0 nm, respectively. Like reference numerals are attached to the structures or components identical or equivalent to those of the aforementioned embodiments. However, any magnetic material other than the layered ferrimagnetic structure film can be employed as the pinned ferromagnetic layer 53, 79.

Similar to the aforementioned spin valve films 36, 36a–36d, the spin valve film 36e is allowed to exhibit a larger variation in the electric resistance in response to the rotation of the magnetization in the free ferromagnetic layer 56. In particular, the spin valve film 36e of this type is supposed to enable the specular reflection or diffusion of electrons between the insulating layers 54d, 54e as well as between the insulating layers 54e, 54. This leads to a still larger variation in the electric resistance in the spin valve film 36e in response to the rotation of the magnetization in the free ferromagnetic layer 56.

The oxide film may be a layered lamination, comprising $Fe_2O_3$ and $Al_2O_3$ layers, of approximately 2.0 nm overall thickness formed over the surface of the first ferromagnetic layer 56a, for example. Sputtering may be employed to form the layered lamination. Alternatively, the introduction of oxygen gas into a vacuum chamber after the formation of the first ferromagnetic layer 56a as described above may be employed to form the oxide film. Oxygen plasma may be employed in place of the simple introduction of the oxygen gas. The oxygen gas and plasma serve to cause oxidation reaction at the surface of the first ferromagnetic layer 56a. The oxidation serves to establish the oxide film spreading over the surface of the first ferromagnetic layer 56a. In these cases, a seed layer such as a Cu layer of approximately 2.0 nm thickness and a Ta layer of approximately 1.0 nm thickness in combination, for example, may be formed on the first ferromagnetic layer 56a prior to the introduction of the oxygen gas or oxygen plasma.

Figure 22:
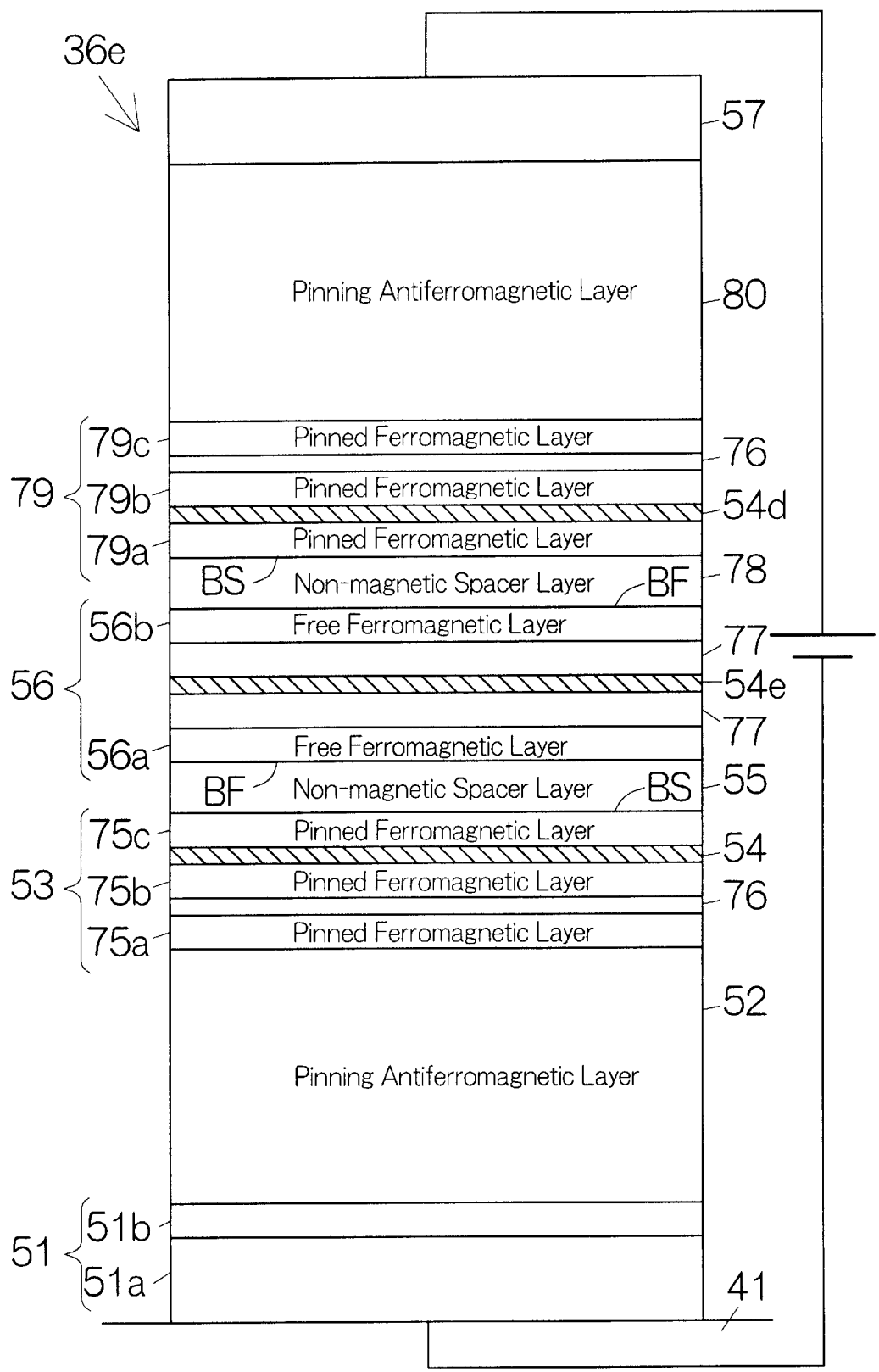
FIG. 22 is an enlarged partial sectional view of the flying head slider for schematically illustrating the structure of a spin valve film according to a modified example of the sixth embodiment.

As shown in FIG. 22, the Cu layer 77 serving as a spacer or break layer may be interposed between the individual ferromagnetic layer 56a, 56b and the insulating layer 54e in the free ferromagnetic layer 56 in this sixth embodiment. Like reference numerals are attached to the structures or components similar or equivalent to those of the aforementioned embodiments in FIG. 22. However, any magnetic material other than the layered ferrimagnetic structure film can be employed as the pinned ferromagnetic layer 53, 79.

Figure 23:
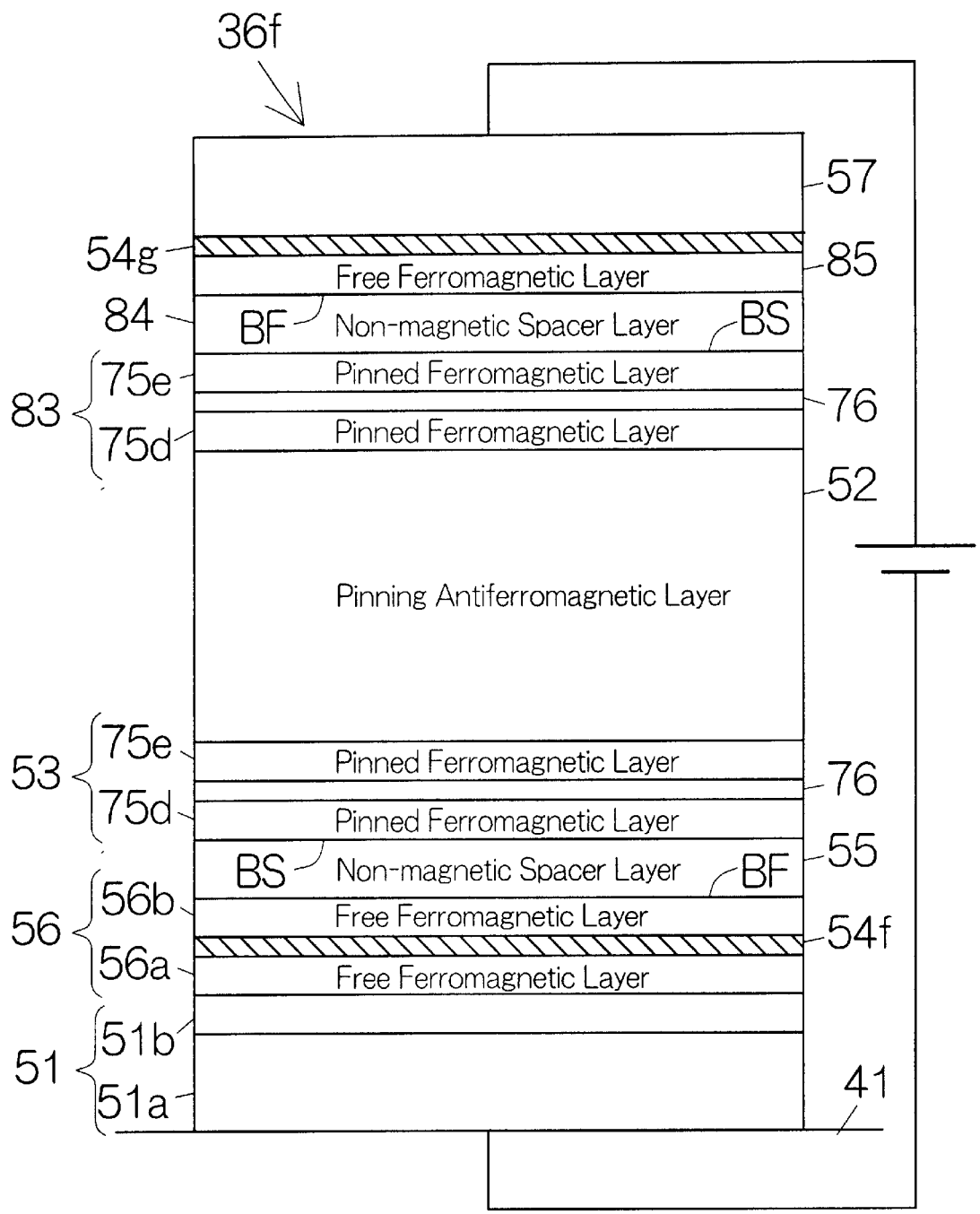
FIG. 23 is an enlarged partial sectional view of the flying head slider for schematically illustrating the structure of a spin valve film according to a seventh embodiment of the present invention.

FIG. 23 illustrates the spin valve film 36f according to a seventh embodiment of the present invention. The spin valve film 36f is a so-called dual spin valve film in which a single antiferromagnetic layer is designed to act on upper and lower spin valve structure films interposing the antiferromagnetic layer. Specifically, the spin valve film 36f includes the base layer 51, the free ferromagnetic layer 56, the non-magnetic spacer layer 55, the pinned ferromagnetic layer 53 and the antiferromagnetic layer 52 stacked one another in this sequence. An insulating layer 54e is embedded within the free ferromagnetic layer 56. The insulating layer 54e may be an oxide film interposed between the first and second ferromagnetic layers 56a, 56b. The second ferromagnetic layer 56b thus serves to space or isolate the insulating layer 54e from the non-magnetic spacer layer 55. The first and second ferromagnetic layers 56a, 56b may be allowed to have the thickness set at approximately 2.0 nm, respectively.

A layered ferrimagnetic structure film is employed as the pinned ferromagnetic layer 53. The layered ferrimagnetic structure film includes a first ferromagnetic layer 75d spreading over the surface of the non-magnetic spacer layer 55, an Ru layer 76 of approximately 0.8 nm thickness spreading over the first ferromagnetic layer 75d, and a second ferromagnetic layer 75e spreading over the Ru layer 76. The Ru layer 76 is thus interposed between the first and second ferromagnetic layers 75d, 75e. The first ferromagnetic layer 75d may be a CoFeB layer of approximately 2.5 nm thickness, while the second ferromagnetic layer 75e may be a CoFeB layer of approximately 2.0 thickness, for example. However, any magnetic material other than the layered ferrimagnetic structure film can be employed as the pinned ferromagnetic layer 53. Like reference numerals are attached to the structures or components identical or equivalent to those of the aforementioned embodiments.

The spin valve film 36f further includes a pinned ferromagnetic layer 83, a non-magnetic spacer layer 84, a free ferromagnetic layer 85 and the Ta layer 57 stacked in this sequence on the antiferromagnetic layer 52. A first planar boundary or interface BF is defined between the free ferromagnetic layer 85 and the non-magnetic spacer layer 84, while a second planar boundary or interface BS is defined between the pinned ferromagnetic layer 83 and the non-magnetic spacer layer 84.

An insulating layer 54g is interposed between the free ferromagnetic layer 85 and the Ta layer 57. The insulating layer 54g may be an $Fe_2O_3$ layer of approximately 2.0 nm thickness, for example. Sputtering may be employed to form the $Fe_2O_3$ layer. The free ferromagnetic layer 85 serves to space or isolate the insulating layer 54g from the non-magnetic spacer layer 84. The thickness of the free ferromagnetic layer 85 may be set at approximately 2.0 nm, for example. The non-magnetic spacer layer 84 is allowed to have the structure identical to that of the aforementioned non-magnetic spacer layer 55.

In this case, a layered ferrimagnetic structure film is employed as the pinned ferromagnetic layer 83. The layered ferrimagnetic structure film includes a first ferromagnetic layer 75d spreading over the antiferromagnetic layer 52, an Ru layer 76 of approximately 0.8 nm thickness spreading over the first ferromagnetic layer 75d, and a second ferromagnetic layer 75e spreading over the Ru layer 76. The Ru layer 76 is accordingly interposed between the first and second ferromagnetic layers 75d, 75e. The first ferromagnetic layer 75d may be a CoFeB layer of approximately 2.0 nm thickness, while the second ferromagnetic layer 75e may be a CoFeB layer of approximately 2.5 thickness, for example. However, any magnetic material other than the layered ferrimagnetic structure film can be employed as the pinned ferromagnetic layer 83. Similar to the aforementioned spin valve films 36, 36a–36e, the spin valve film 36f is allowed to exhibit a larger variation in the electric resistance in response to the rotation of the magnetization in the free ferromagnetic layers 56, 85.

The electric resistance was actually measured in the aforementioned CPP structure spin valve MR element 30. In measurement, sixteen kinds of the spin valve films were prepared. The spin valve MR element of Specimen (a1) was designed to include the spin valve film 36 according to the first embodiment shown in FIG. 4. The spin valve MR element of Specimen (b1) was designed to include spin valve film 36a according to the second embodiment shown in FIG. 14.

The spin valve MR elements of Specimen (c1) to (c4) were designed to include the spin valve film 36b according to the aforementioned third embodiment, respectively. Sputtering was employed to form the insulating layer 54b, comprising $Fe_2O_3$ and $Al_2O_3$ layers, on the surface of the free ferromagnetic layer 56, as shown in FIG. 15, in the spin valve film 36b of Specimen (c1). The surface of the free ferromagnetic layer 56 was exposed to oxygen gas so as to form the insulating layer 54b spreading over the surface of the free ferromagnetic layer 56 in the spin valve film 36b of Specimen (c2). Likewise, oxygen plasma was employed to form the insulating layer 54b over the surface of the free ferromagnetic layer 56 in the spin valve film 36b of Specimen (c3). In these cases, the Cu layer 77 was not formed between the free ferromagnetic layer 56 and the insulating layer 54b. Furthermore, the insulating layer 54b was embedded within the free ferromagnetic layer 56, as shown in FIG. 16, in the spin valve film 36b of Specimen (c4). Sputtering was employed to form the insulating layer 54b, comprising $Fe_2O_3$ and $Al_2O_3$ layers, on the surface of the first ferromagnetic layer 56a in the spin valve film 36b of Specimen (c4).

The spin valve MR elements of Specimen (d1) to (d4) were designed to include the spin valve film 36c according to the aforementioned fourth embodiment, respectively. Sputtering was employed to form the insulating layer 54c, comprising $Fe_2O_3$ and $Al_2O_3$ layers, on the surface of the free ferromagnetic layer 56, as shown in FIG. 17, in the spin valve film 36c of Specimen (d1). The surface of the free ferromagnetic layer 56 was exposed to oxygen gas so as to form the insulating layer 54c spreading over the surface of the free ferromagnetic layer 56 in the spin valve film 36c of Specimen (d2). Likewise, oxygen plasma was employed to form the insulating layer 54c over the surface of the free ferromagnetic layer 56 in the spin valve film 36c of Specimen (d3). In these cases, the Cu layer 77 was not formed between the free ferromagnetic layer 56 and the insulating layer 54c. Furthermore, the Cu layer 77 was interposed between the free ferromagnetic layer 56 and the insulating layer 54c, as shown in FIG. 19, in the spin valve film 36c of Specimen (d4). Sputtering was employed to form the insulating layer 54c, comprising $Fe_2O_3$ and $Al_2O_3$ layers, on the surface of the Cu layer 77 in the spin valve film 36c of Specimen (d4).

Furthermore, the spin valve MR element of Specimen (e1) was designed to include the spin valve film 36d according to the fifth embodiment shown in FIG. 20. Similarly, the spin valve MR elements of Specimen (f1) to (f4) were designed to include the spin valve film 36e according to the aforementioned sixth embodiment, respectively. Sputtering was employed to form the insulating layer 54e, comprising $Fe_2O_3$ and $Al_2O_3$ layers, on the surface of the first ferromagnetic layer 56a, as shown in FIG. 21, in the spin valve film 36e of Specimen (f1). The surface of the first ferromagnetic layer 56a was exposed to oxygen gas so as to form the insulating layer 54e spreading over the surface of the first ferromagnetic layer 56a in the spin valve film 36e of Specimen (f2). Likewise, oxygen plasma was employed to form the insulating layer 54e over the surface of the first ferromagnetic layer 56a in the spin valve film 36e of Specimen (f3). In these cases, the Cu layer 77 was not formed between the ferromagnetic layer 56a, 56b and the insulating layer 54e. Furthermore, the Cu layer 77 was interposed between the individual ferromagnetic layer 56a, 56b and the insulating layer 54e, as shown in FIG. 22, in the spin valve film 36e of Specimen (f4). Sputtering was employed to form the insulating layer 54e, comprising $Fe_2O_3$ and $Al_2O_3$ layers, on the surface of the Cu layer 77 in the spin valve film 36e of Specimen (f4). The spin valve MR element of Specimen (g1) was designed to include the spin valve film 36f according to the seventh embodiment shown in FIG. 23.

Four kinds of comparative examples were prepared. The insulating layer 54 was eliminated from the spin valve MR element of Specimen (a1) so as to provide a spin valve MR element of Specimen (a0). The thickness of the pinned ferromagnetic layer 53 was set at 4.5 nm. The insulating layer 54 was likewise eliminated from the spin valve MR element of Specimen (b1) so as to provide a spin valve MR element of Specimen (b0). In this case, the thickness of the ferromagnetic layer contacting the non-magnetic spacer layer 55 was set at 2.5 nm. In addition, the insulating layers 54, 54d were eliminated from the spin valve MR element of Specimen (e1) so as to provide a spin valve MR element of Specimen (e0). The thickness of the ferromagnetic layer contacting the individual non-magnetic spacer layer 55, 78 was set at 2.5 nm, respectively. Furthermore, the insulating layers 54f, 54g were eliminated from the spin valve MR element of Specimen (g1) so as to provide a spin valve MR element of Specimen (g0). The measurement revealed the following results.

TABLE 1

| Specimen ID | (a0) | (a1) |
|---|---|---|
| Variation in Resistance $\Delta R$ [m$\Omega\mu m^2$] | 0.32 | 0.62 |

TABLE 2

| Specimen ID | (b0) | (b1) | | |
|---|---|---|---|---|
| Variation in Resistance $\Delta R$ [m$\Omega\mu m^2$] | 0.49 | 0.84 | | |
| Specimen ID | (c1) | (c2) | (c3) | (c4) |
| Variation in Resistance $\Delta R$ [m$\Omega\mu m^2$] | 23.81 | 0.86 | 15.92 | 23.62 |
| Specimen ID | (d1) | (d2) | (d3) | (d4) |
| Variation in Resistance $\Delta R$ [m$\Omega\mu m^2$] | 72.01 | 3.23 | 43.75 | 72.74 |

TABLE 3

| Specimen ID | (e0) | (e1) | | |
|---|---|---|---|---|
| Variation in Resistance $\Delta R$ [m$\Omega\mu m^2$] | 3.34 | 6.38 | | |
| Specimen ID | (f1) | (f2) | (f3) | (f4) |
| Variation in Resistance $\Delta R$ [m$\Omega\mu m^2$] | 65.32 | 7.18 | 40.54 | 66.74 |

TABLE 4

| Specimen ID | (g0) | (g1) |
|---|---|---|
| Variation in Resistance $\Delta R$ [m$\Omega\mu m^2$] | 2.26 | 29.26 |

As is apparent from Tables 1–4, the spin valve MR elements of Specimen (a1), (b1), (c1)–(c4), (e1), (f1)–(f4) and (g1) exhibited a remarkable increase in the variation in the electric resistance at 1.0 $\mu m^2$ as compared with the spin valve MR elements of Specimen (a0), (b0), (e0) and (g0) without the insulating layers. It has been proved that the introduction of the insulating layer 54, 54b–54g greatly contributes to increase in the variation in the electric resistance of the spin valve MR element 30. In particular, the result of the measurement has revealed that the spin valve MR element 30 including the insulating layer comprising the $Fe_2O_3$ and $Al_2O_3$ layers formed by sputtering, such as Specimen (c1), (c4), (d1), (d4), (f1) and (f4), exhibits a still larger variation in the electric resistance as compared with the spin valve MR element 30 including the insulating layer resulting from the oxygen gas or oxygen plasma. Still further, as is apparent from the result for Specimen (d1)–(d4) and (f1)–(f4), when the spin valve MR element 30 included not only the insulating layer 54, 54d spaced by the ferromagnetic layer 53b, 79a of the pinned ferromagnetic layer 53, 79 from the non-magnetic spacer layer 55, 78 but also the insulating layer 54c, 54e spaced by the free ferromagnetic layer 56, 56a, 56b from the non-magnetic spacer layer 55, 78, the spin valve MR element 30 was allowed to exhibit the largest variation in the electric resistance.

Figure 24A:
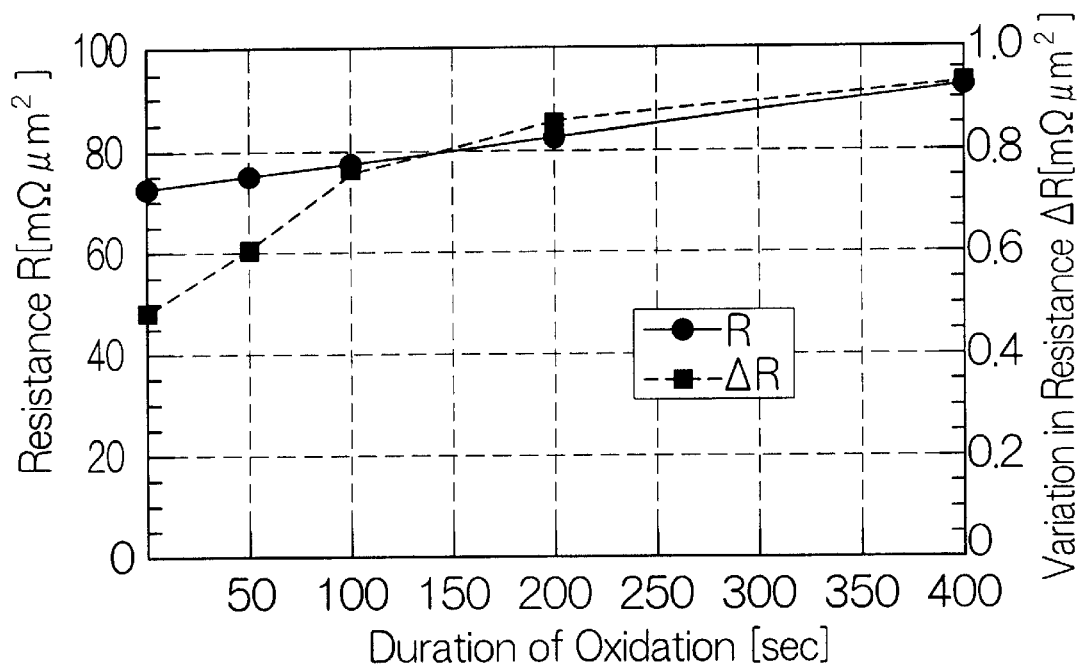
FIG. 24A is a graph illustrating the relationship between the duration of oxidation and the resistive value as well as the variation in the resistance in the spin valve MR element of Specimen (b1)
Figure 24B:
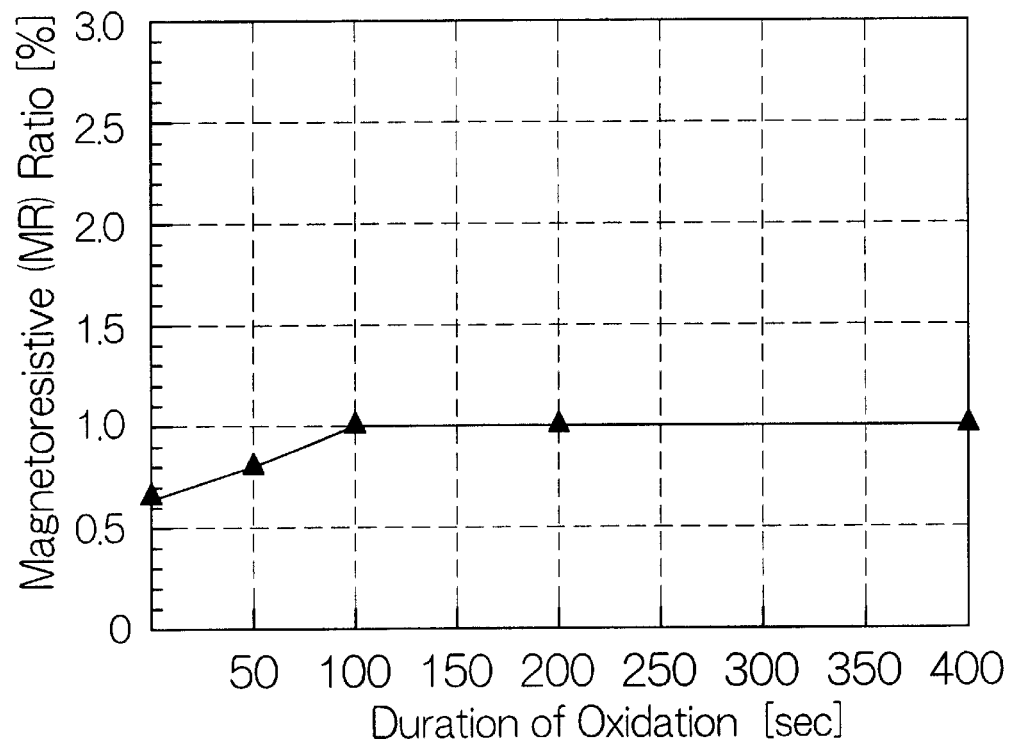
FIG. 24B is a graph illustrating the relationship between the duration of oxidation and the magnetoresistive (MR) ratio in the spin valve MR element of Specimen (b1)

Furthermore, the inventors examined the influence of the oxidation in the spin valve MR element 30 of Specimen (b1). The inventors measured the maximum value of the electric resistance at 1.0 $\mu m^2$ in the spin valve MR element 30. Simultaneously, the inventors measured the variation in the electric resistance in response to the reversal of the acting magnetic polarity. The duration for exposing the ferromagnetic layer to the oxygen gas was varied. The oxygen gas was introduced into the chamber at the amount of 0.2 [sccm]. As shown in FIGS. 24A and 24B, the duration of oxidation exceeding 100 seconds led to a larger variation in the resistance and a larger magnetoresistive (MR) ratio.

Figure 25A:
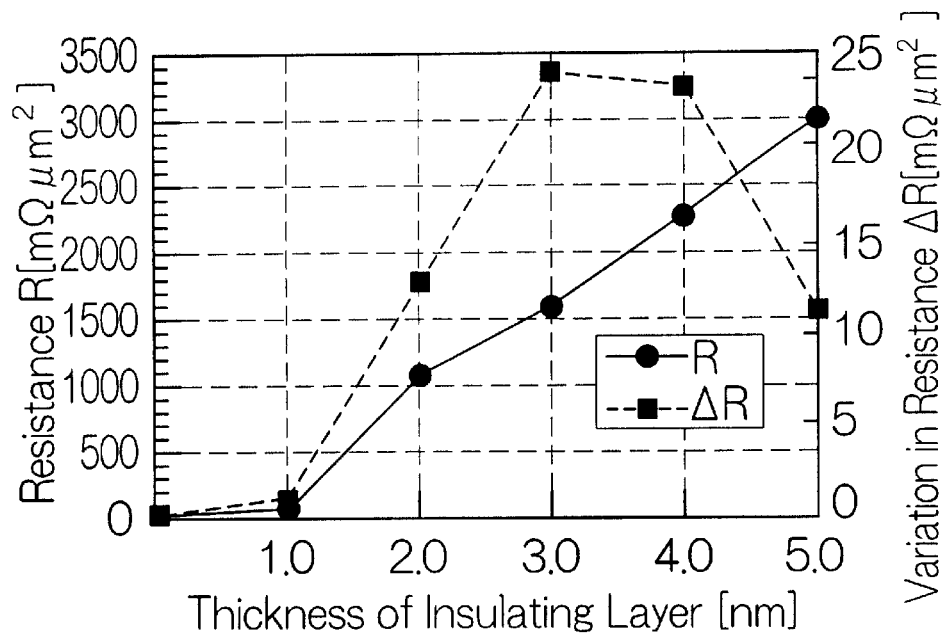
FIG. 25A is a graph illustrating the relationship between the thickness of the insulating layer and the resistive value as well as the variation in the resistance in the spin valve MR element of Specimen (c1)
Figure 25B:
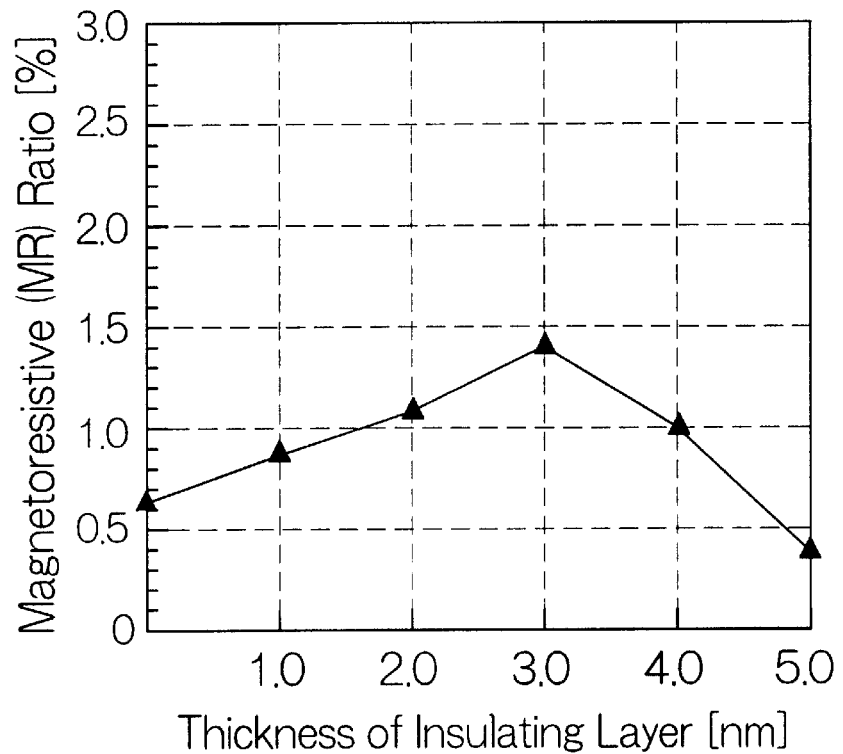
FIG. 25B is a graph illustrating the relationship between the thickness of the insulating layer and the magnetoresistive (MR) ratio in the spin valve MR element of Specimen (c1)

Furthermore, the inventors examined the influence of the thickness of the insulating layer 54b in the spin valve MR element 30 of Specimen (c1). The inventors measured the maximum value of the electric resistance at 1.0 $\mu m^2$ in the spin valve MR element 30. Simultaneously, the inventors measured the variation in the electric resistance in response to the reversal of the acting magnetic polarity. As shown in FIGS. 25A and 25B, the insulating layer 54b having the thickness of 3.0 nm greatly contributed to a larger variation in the resistance and a larger magnetoresistive (MR) ratio.

Figure 26A:
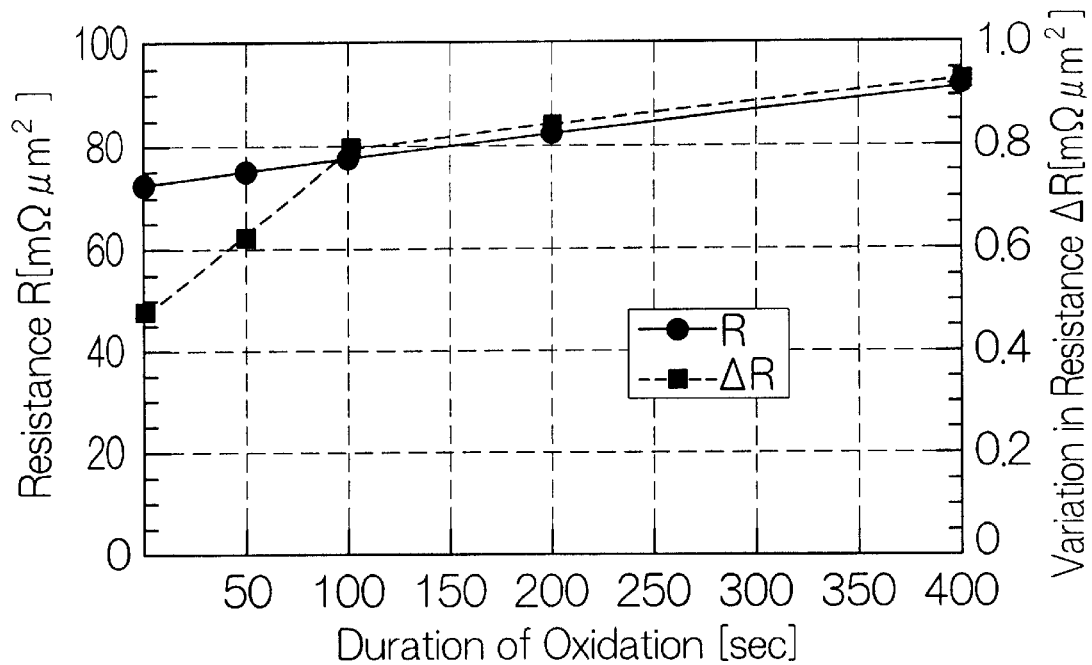
FIG. 26A is a graph illustrating the relationship between the duration of oxidation and the resistive value as well as the variation in the resistance in the spin valve MR element of Specimen (c2)
Figure 26B:
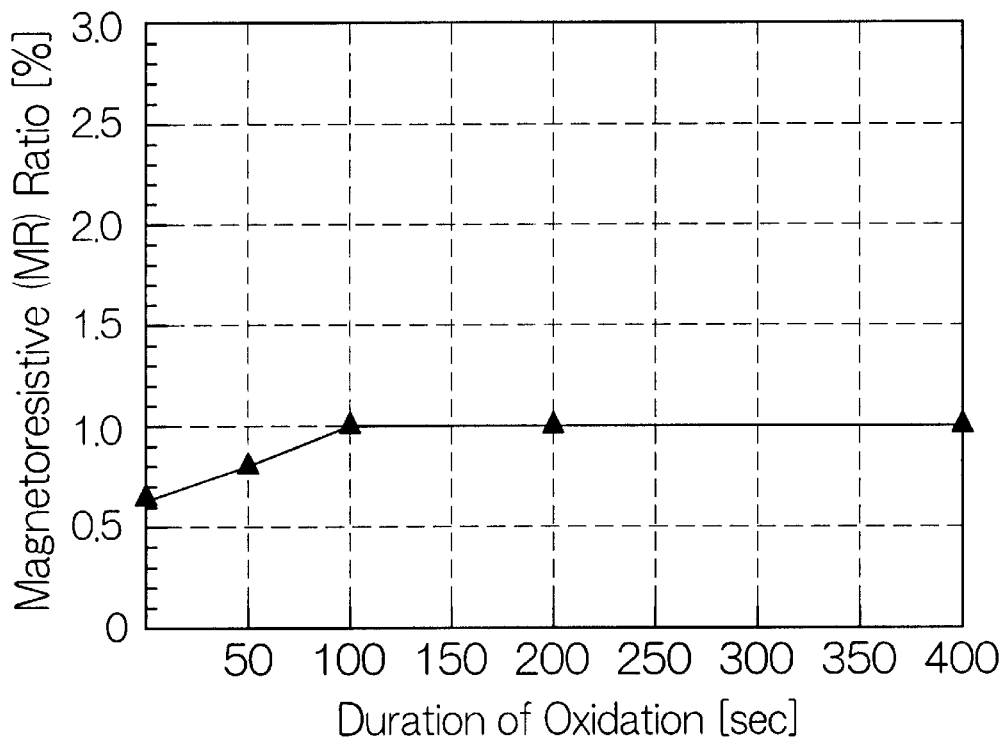
FIG. 26B is a graph illustrating the relationship between the duration of oxidation and the magnetoresistive (MR) ratio in the spin valve MR element of Specimen (c2)

Furthermore, the inventors examined the influence of the oxidation in the spin valve MR element 30 of Specimen (c2). The inventors measured the maximum value of the electric resistance at 1.0 $\mu m^2$ in the spin valve MR element 30. Simultaneously, the inventors measured the variation in the electric resistance in response to the reversal of the acting magnetic polarity. The duration for exposing the ferromagnetic layer to the oxygen gas was varied. The oxygen gas was introduced into the chamber at the amount of 0.2 [sccm]. As shown in FIGS. 26A and 26B, the duration of oxidation exceeding 100 seconds led to a larger variation in the resistance and a larger magnetoresistive (MR) ratio.

Figure 27A:
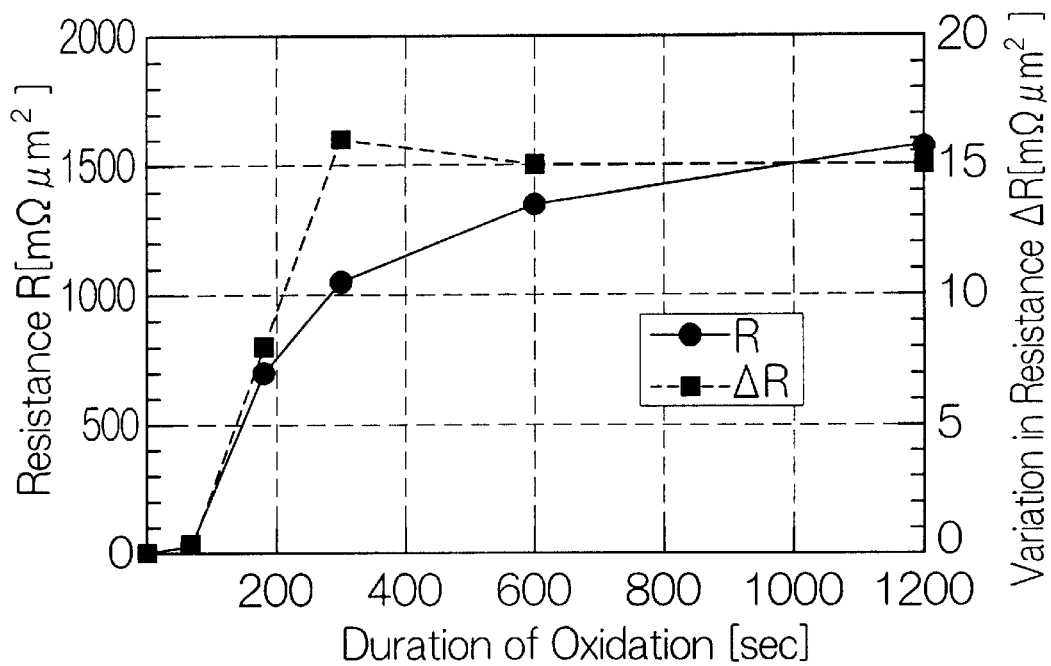
FIG. 27A is a graph illustrating the relationship between the duration of oxidation and the resistive value as well as the variation in the resistance in the spin valve MR element of Specimen (c3)
Figure 27B:
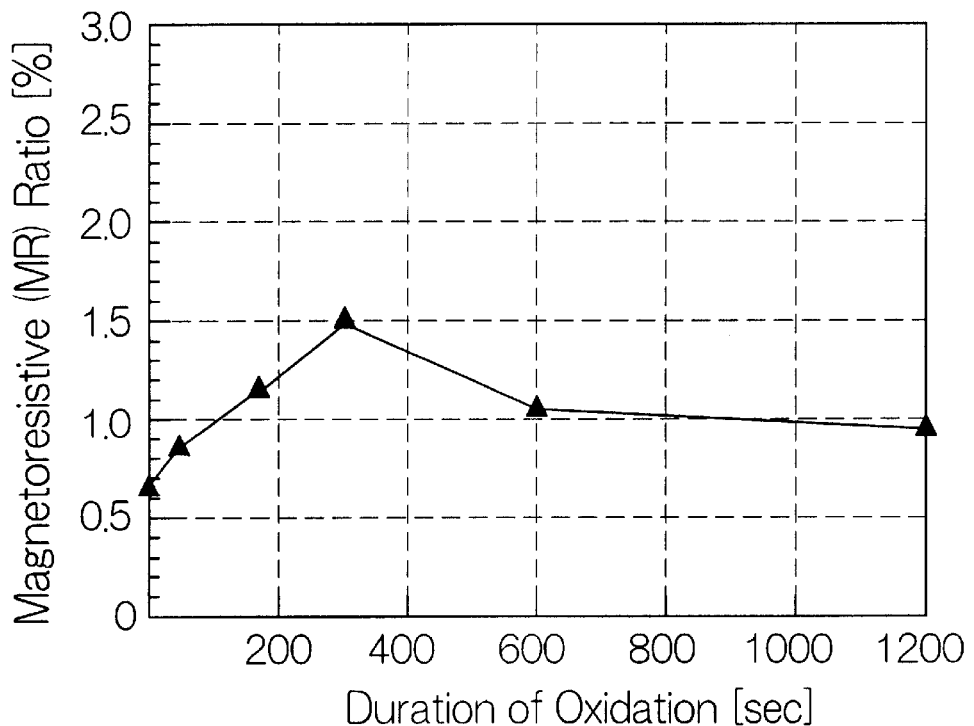
FIG. 27B is a graph illustrating the relationship between the duration of oxidation and the magnetoresistive (MR) ratio in the spin valve MR element of Specimen (c3)

Furthermore, the inventors examined the influence of the oxidation in the spin valve MR element 30 of Specimen (c3). The inventors measured the maximum value of the electric resistance at 1.0 $\mu m^2$ in the spin valve MR element 30. Simultaneously, the inventors measured the variation in the electric resistance in response to the reversal of the acting magnetic polarity. The duration for subjecting the ferromagnetic layer to the oxygen plasma was varied. The pressure in the chamber was maintained at 1.0 [Pa]. As shown in FIGS. 27A and 27B, the duration of oxidation exceeding 300 seconds led to a larger variation in the resistance. Also, the duration of oxidation set at 300 seconds led to the largest magnetoresistive (MR) ratio.

Figure 28A:
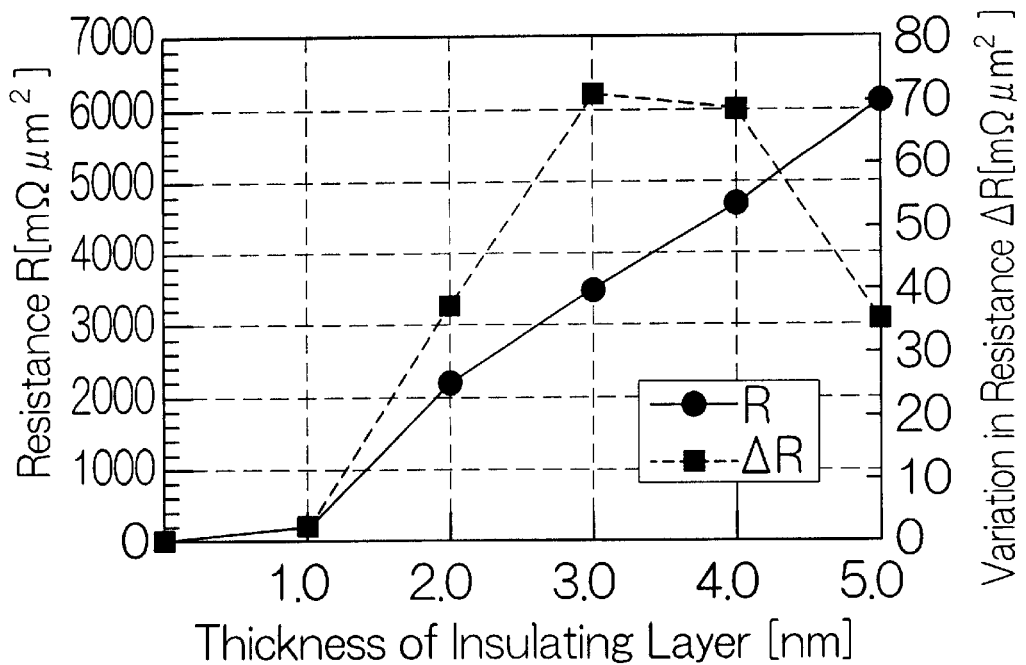
FIG. 28A is a graph illustrating the relationship between the thickness of the insulating layer on the free ferromagnetic layer and the resistive value as well as the variation in the resistance in the spin valve MR element of Specimen (d1)
Figure 28B:
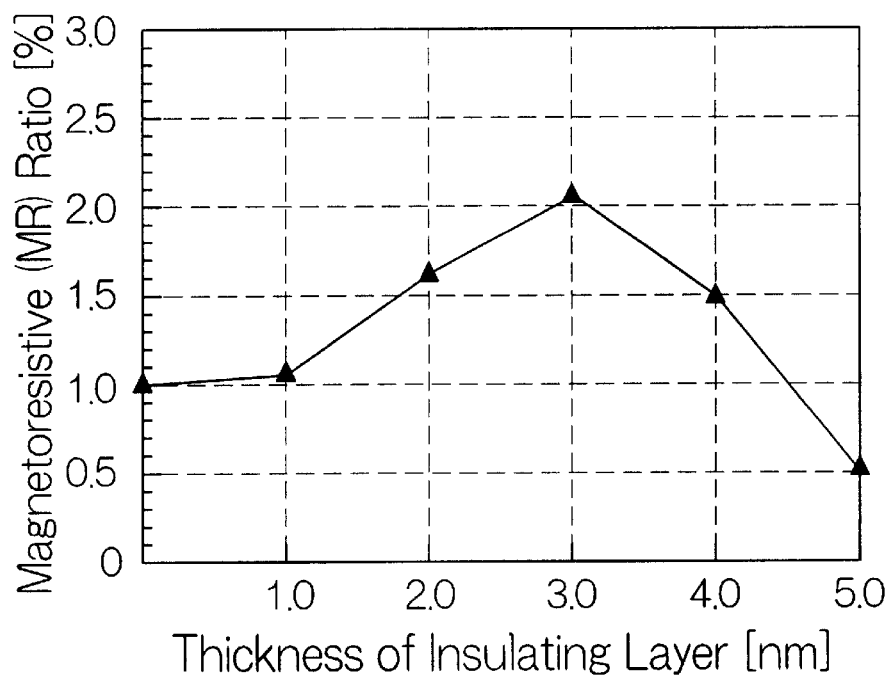
FIG. 28B is a graph illustrating the relationship between the thickness of the insulating layer on the free ferromagnetic layer and the magnetoresistive (MR) ratio in the spin valve MR element of Specimen (d1)

Furthermore, the inventors examined the influence of the thickness of the insulating layer 54c in the spin valve MR element 30 of Specimen (d1). The inventors measured the maximum value of the electric resistance at 1.0 $\mu m^2$ in the spin valve MR element 30. Simultaneously, the inventors measured the variation in the electric resistance in response to the reversal of the acting magnetic polarity. As shown in FIGS. 28A and 28B, the insulating layer 54c having the thickness of 3.0 nm led to a larger variation in the resistance and the largest magnetoresistive (MR) ratio.

Figure 29A:
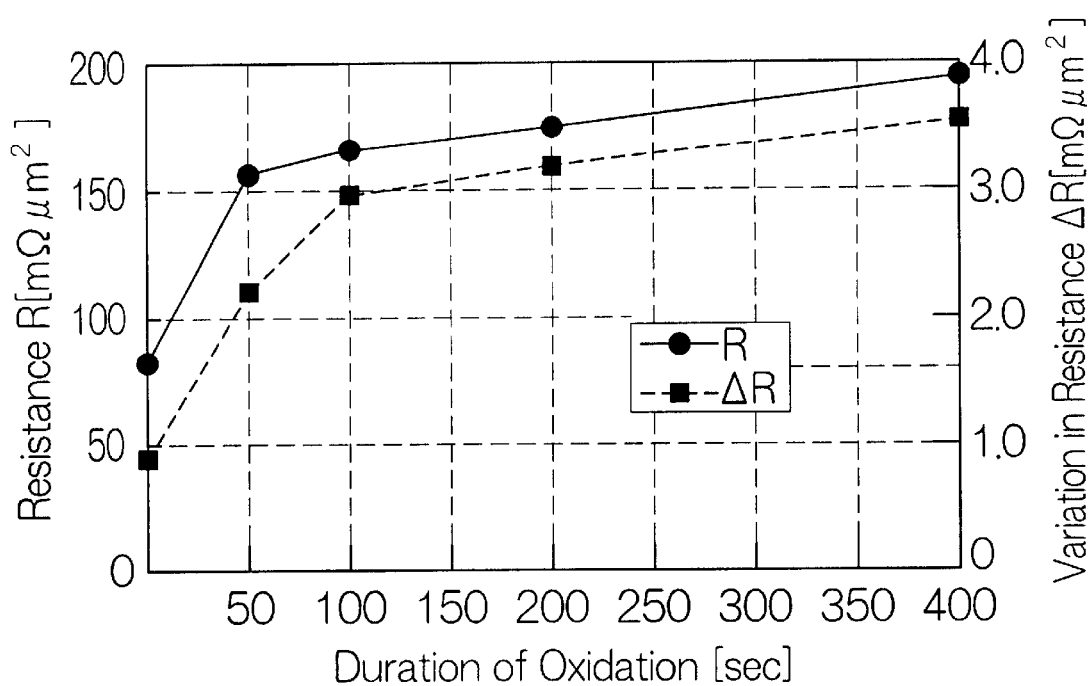
FIG. 29A is a graph illustrating the relationship between the duration of oxidation on the free ferromagnetic layer and the resistive value as well as the variation in the resistance in the spin valve MR element of Specimen (d2)
Figure 29B:
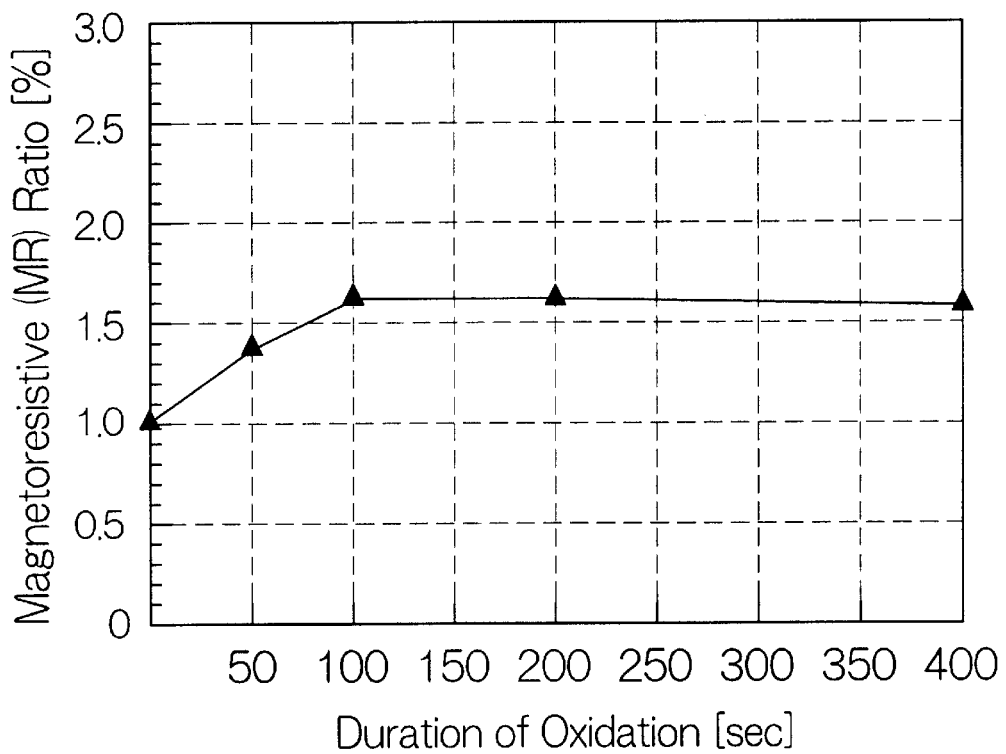
FIG. 29B is a graph illustrating the relationship between the duration of oxidation on the free ferromagnetic layer and the magnetoresistive (MR) ratio in the spin valve MR element of Specimen (d2)

Furthermore, the inventors examined the influence of the oxidation on the free ferromagnetic layer 56 in the spin valve MR element 30 of Specimen (d2). The inventors measured the maximum value of the electric resistance at 1.0 $\mu m^2$ in the spin valve MR element 30. Simultaneously, the inventors measured the variation in the electric resistance in response to the reversal of the acting magnetic polarity. The duration for exposing the free ferromagnetic layer 56 to the oxygen gas was varied. The oxygen gas was introduced into the chamber at the amount of 0.2 [sccm]. As shown in FIGS. 29A and 29B, the duration of oxidation exceeding 100 seconds led to a larger variation in the resistance and a larger magnetoresistive (MR) ratio.

Figure 30A:
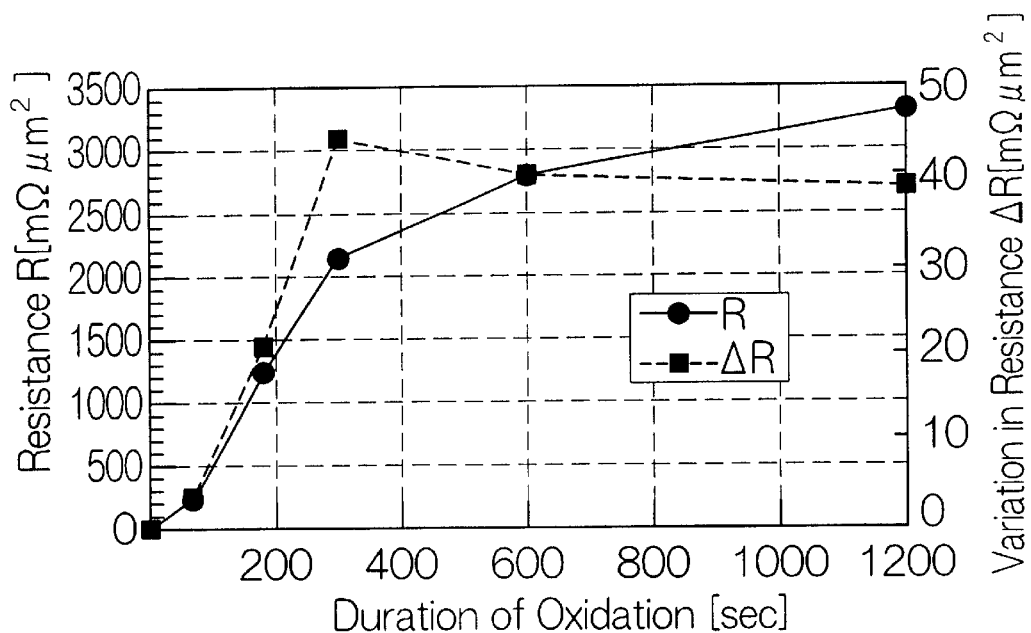
FIG. 30A is a graph illustrating the relationship between the duration of oxidation on the free ferromagnetic layer and the resistive value as well as the variation in the resistance in the spin valve MR element of Specimen (d3)
Figure 30B:
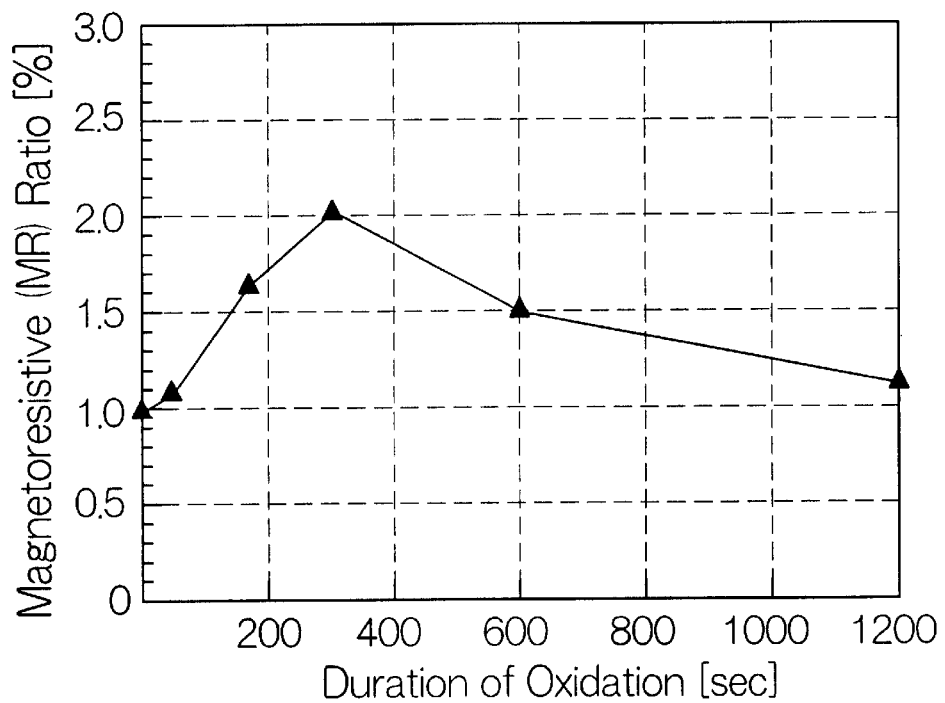
FIG. 30B is a graph illustrating the relationship between the duration of oxidation on the free ferromagnetic layer and the magnetoresistive (MR) ratio in the spin valve MR element of Specimen (d3)

Furthermore, the inventors examined the influence of the oxidation on the free ferromagnetic layer 56 in the spin valve MR element 30 of Specimen (d3). The inventors measured the maximum value of the electric resistance at 1.0 $\mu m^2$ in the spin valve MR element 30. Simultaneously, the inventors measured the variation in the electric resistance in response to the reversal of the acting magnetic polarity. The duration for subjecting the free ferromagnetic layer 56 to the oxygen plasma was varied. The pressure in the chamber was maintained at 1.0 [Pa]. As shown in FIGS. 30A and 30B, the duration of oxidation exceeding 300 seconds led to a larger variation in the resistance. Also, the duration of oxidation set at 300 seconds led to the largest magnetoresistive (MR) ratio.

Figure 31A:
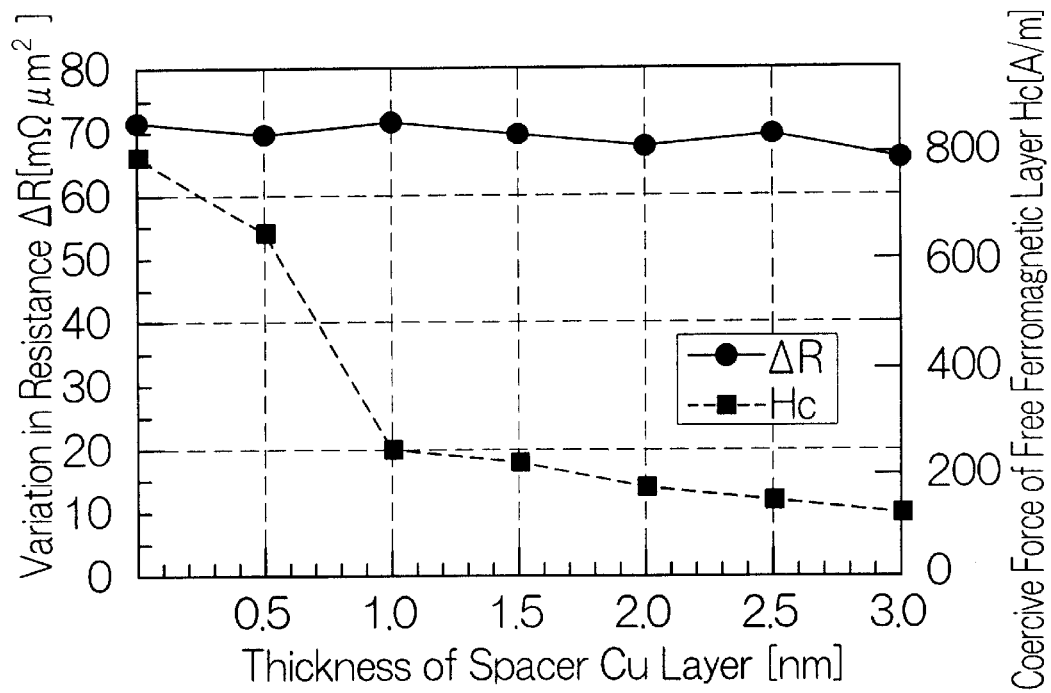
FIGS. 31A and 31B are graphs illustrating the relationship between the thickness of the spacer Cu layer and the variation in the resistance as well as the coercive force of the free ferromagnetic layer.

Furthermore, the inventors examined the influence of the thickness of the Cu layer 77 in the spin valve MR element 30 of Specimen (d4). The inventors measured the variation in the electric resistance in response to the reversal of the acting magnetic polarity. As shown in FIG. 31A, it has been confirmed that a constant variation in the electric resistance can be obtained in the CPP structure spin valve MR element 30. Moreover, the Cu layer 77 having the thickness exceeding 1.0 nm led to a larger reduction in the coercive force Hc of the free ferromagnetic layer 56. Advantages of the Cu layer 77 have been proved. In particular, it was preferable that the Cu layer had the thickness equal to or larger than 2.0 nm.

Figure 31B:
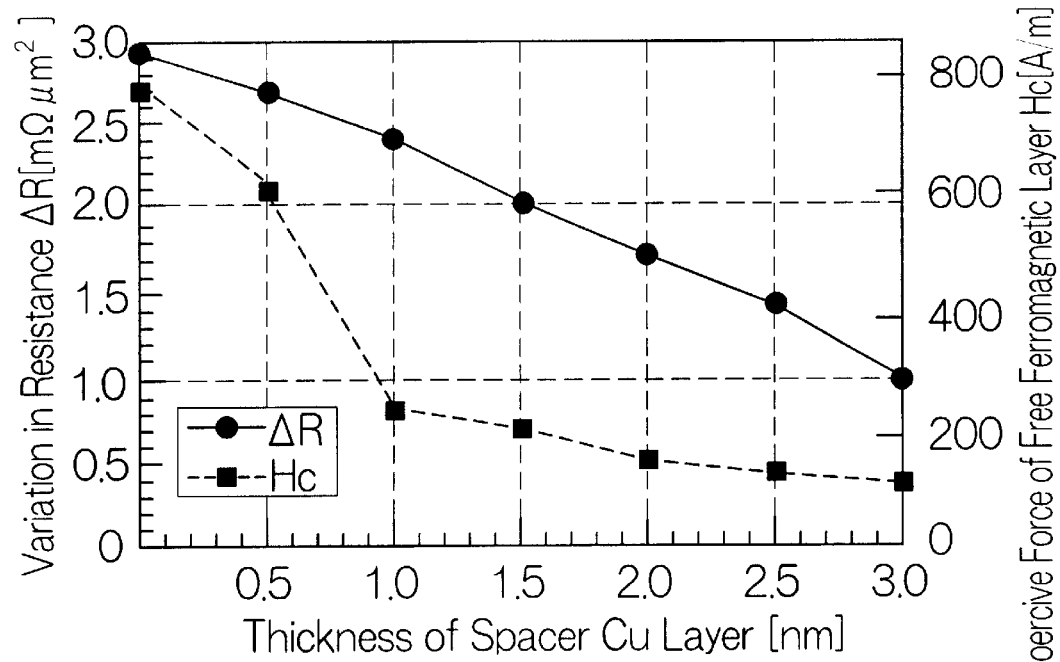

On the other hand, an increased thickness of the Cu layer as a spacer or break layer led to a reduction in the electric resistance in a current in-the-plane (CIP) structure spin valve MR element, as shown in FIG. 31B. The CIP structure spin valve MR element was designed to include a pair of terminal or lead layers and domain control stripe layers both interposing the spin valve film 36c along the surface of a non-magnetic layer spreading over the aforementioned lower shield layer 32, as conventionally known. The spin valve film 36c was allowed to receive the electric current from the lead layers and the domain control stripe layers in the transverse direction.

Figure 32A:
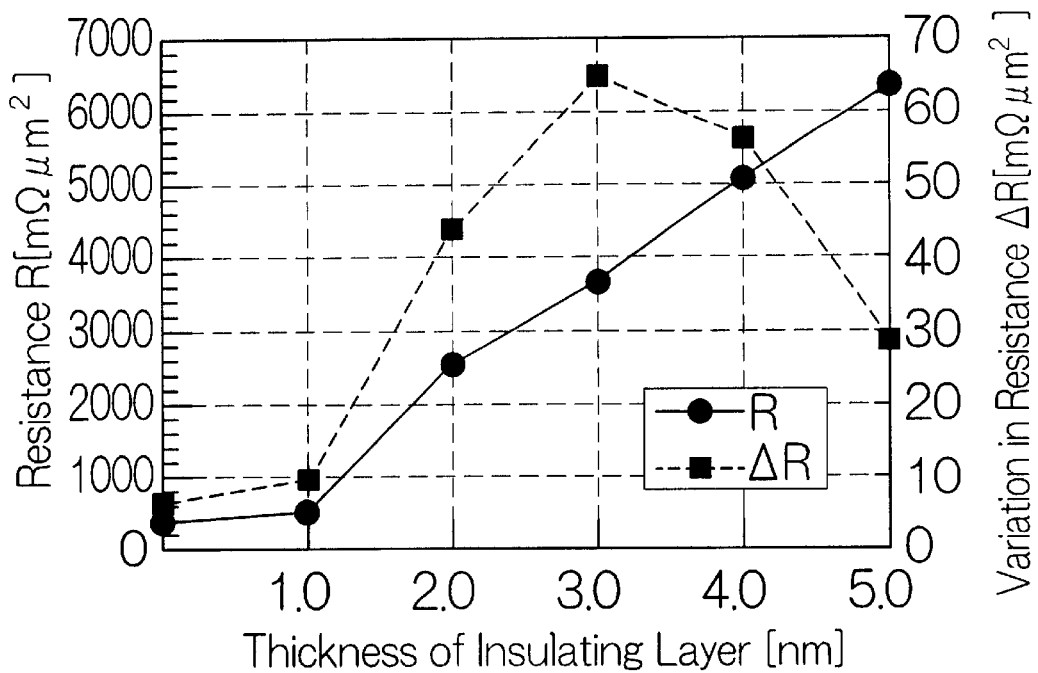
FIG. 32A is a graph illustrating the relationship between the thickness of the insulating layer on the free ferromagnetic layer and the resistive value as well as the variation in the resistance in the spin valve MR element of Specimen (f1)
Figure 32B:
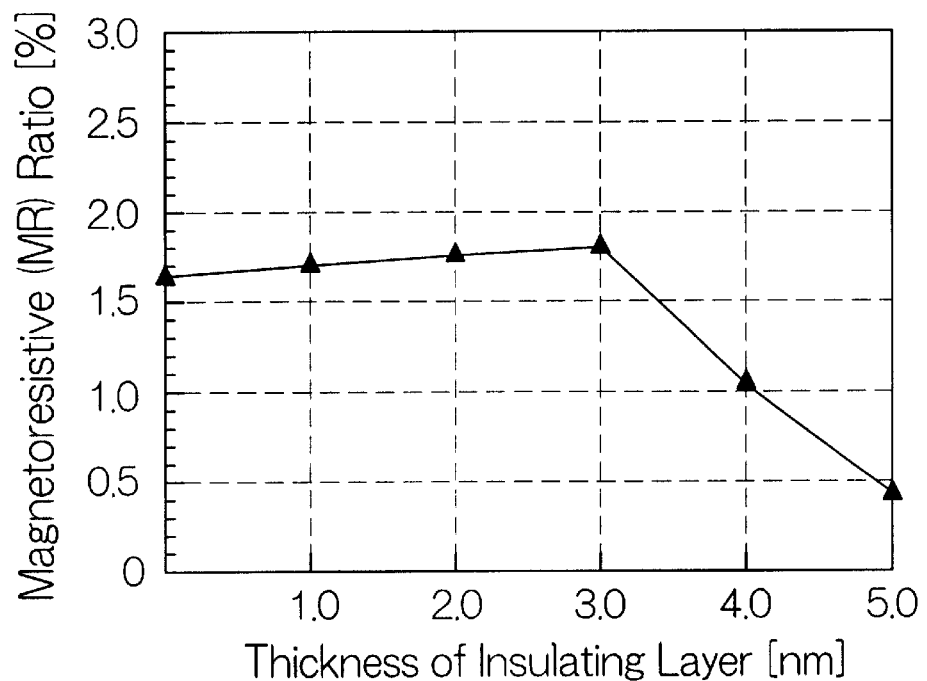
FIG. 32B is a graph illustrating the relationship between the thickness of the insulating layer on the free ferromagnetic layer and the magnetoresistive (MR) ratio in the spin valve MR element of Specimen (f1)

Furthermore, the inventors examined the influence of the thickness of the insulating layer 54e in the spin valve MR element 30 of Specimen (f1). The inventors measured the maximum value of the electric resistance at 1.0 $\mu m^2$ in the spin valve MR element 30. Simultaneously, the inventors measured the variation in the electric resistance in response to the reversal of the acting magnetic polarity. As shown in FIGS. 32A and 32B, the insulating layer 54e having the thickness of 3.0 nm led to a larger variation in the resistance and the largest magnetoresistive (MR) ratio.

Figure 33A:
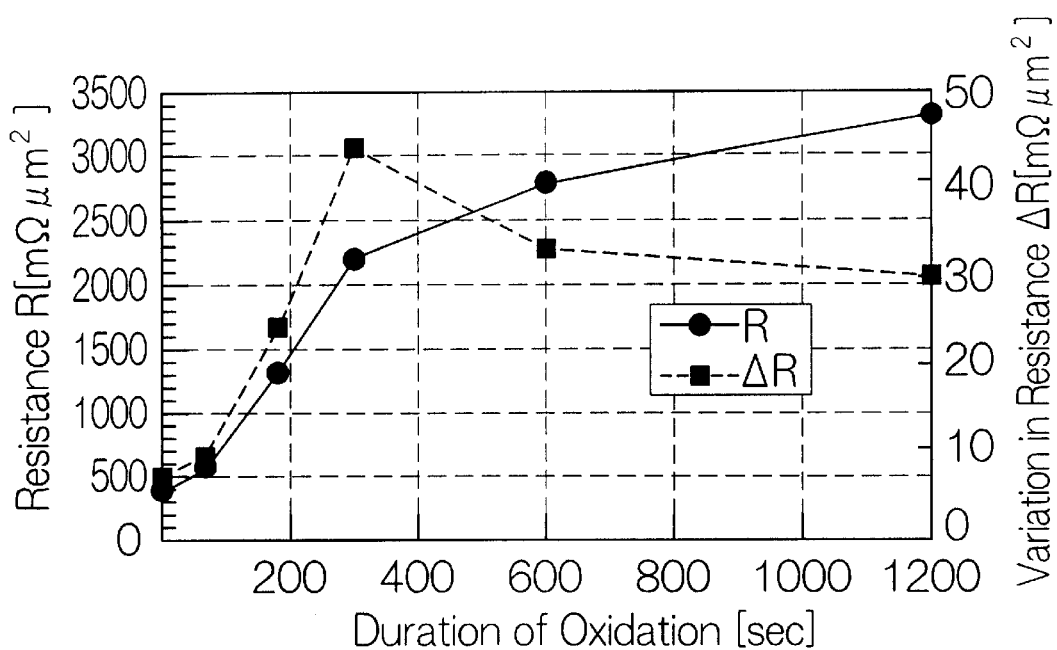
FIG. 33A is a graph illustrating the relationship between the duration of oxidation on the free ferromagnetic layer and the resistive value as well as the variation in the resistance in the spin valve MR element of Specimen (f3)
Figure 33B:
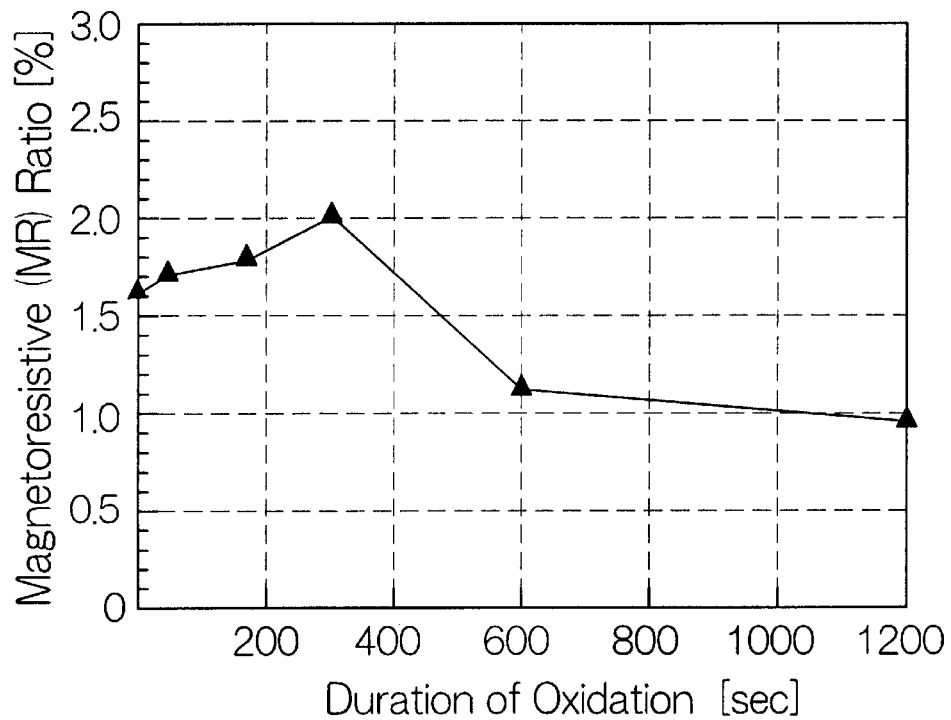
FIG. 33B is a graph illustrating the relationship between the duration of oxidation on the free ferromagnetic layer and the magnetoresistive (MR) ratio in the spin valve MR element of Specimen (f3).

Furthermore, the inventors examined the influence of the oxidation on the ferromagnetic layer 56a in the spin valve MR element 30 of Specimen (f3). The inventors measured the maximum value of the electric resistance at 1.0 $\mu m^2$ in the spin valve MR element 30. Simultaneously, the inventors measured the variation in the electric resistance in response to the reversal of the acting magnetic polarity. The duration for subjecting the ferromagnetic layer 56a to the oxygen plasma was varied. The pressure in the chamber was maintained at 1.0 [Pa]. As shown in FIGS. 33A and 33B, the duration of oxidation set at 300 seconds led to the largest variation in the resistance as well as the largest magnetoresistive (MR) ratio.

It should be noted that the aforementioned insulating layer 54, 54b–54g are only allowed to contain a compound consisting of at least elements of two kinds. Accordingly, the compound may include, in addition to the aforementioned oxide, a sulfide, a nitride, a carbide, a boride, and the like.

What is claimed is:

1. A current perpendicular-to-the-plane structure spin valve magnetoresistive transducer comprising:
    a free ferromagnetic layer;
    a non-magnetic spacer layer contacting the free ferromagnetic layer over a first interface;
    a pinned ferromagnetic layer contacting the non-magnetic spacer layer over a second interface; and
    an insulating layer spaced by the pinned ferromagnetic layer from the non-magnetic spacer layer.

2. The current perpendicular-to-the-plane structure spin valve magnetoresistive transducer according to claim 1, wherein said insulating layer includes a compound consisting of at least two different elements.

3. The current perpendicular-to-the-plane structure spin valve magnetoresistive transducer according to claim 2, wherein said compound is an oxide.

4. The current perpendicular-to-the-plane structure spin valve magnetoresistive transducer according to claim 1, further comprising another pinned ferromagnetic layer contacting an antiferromagnetic layer, wherein said insulating layer is interposed between said pinned ferromagnetic layers.

5. The current perpendicular-to-the-plane structure spin valve magnetoresistive transducer according to claim 1, further comprising an antiferromagnetic layer, wherein the insulating layer is disposed between the pinned ferromagnetic layer and the antiferromagnetic layer.

6. The current perpendicular-to-the-plane structure spin valve magnetoresistive transducer according to claim 1, wherein said insulating layer includes a plurality of pinholes.

7. A current perpendicular-to-the-plane structure spin valve magnetoresistive transducer comprising:

a free ferromagnetic layer;

a non-magnetic spacer layer contacting the free ferromagnetic layer over a first interface;

a pinned ferromagnetic layer contacting the non-magnetic spacer layer over a second interface; and an insulating layer spaced by the free ferromagnetic layer from the non-magnetic spacer layer.

8. The current perpendicular-to-the-plane structure spin valve magnetoresistive transducer according to claim 7, wherein said insulating layer includes a compound consisting of at least two different elements.

9. The current perpendicular-to-the-plane structure spin valve magneto resistive transducer according to claim 6, wherein said compound is an oxide.

10. The current perpendicular-to-the-plane structure spin valve magnetoresistive transducer according to claim 7, further comprising another free ferromagnetic layer, wherein said insulating layer is interposed between said free ferromagnetic layers.

11. The current perpendicular-to-the-plane structure spin valve magnetoresistive transducer according to claim 7, further comprising another insulating layer spaced by the pinned ferromagnetic layer from the non-magnetic spacer layer.

12. The current perpendicular-to-the-plane structure spin valve magnetoresistive transducer according to claim 11, wherein said another insulating layer includes a compound consisting of at least two different elements.

13. The current perpendicular-to-the-plane structure spin valve magnetoresistive transducer according to claim 10, wherein said compound is an oxide.

14. The current perpendicular-to-the-plane structure spin valve magnetoresistive transducer according to claim 11, further comprising another pinned ferromagnetic layer, wherein said insulating layer is interposed between said pinned ferromagnetic layers.

15. The current perpendicular-to-the-plane structure spin valve magnetoresistive transducer according to claim 7, wherein said insulating layer contacts said free ferromagnetic layer.

16. The current perpendicular-to-the-plane structure spin valve magnetoresistive transducer according to claim 7, further comprising a cap layer spaced by the free ferromagnetic layer from the non-magnetic spacer layer, wherein said insulating layer is disposed between the free ferromagnetic layer and the cap layer.

17. The current perpendicular-to-the-plane structure spin valve magnetoresistive transducer according to claim 16, wherein said cap layer includes at least one of Cu and Au.

18. The current perpendicular-to-the-plane structure spin valve magnetoresistive transducer according to claim 7, wherein said insulating layer includes a plurality of pinholes.

* * * * *

UNITED STATES PATENT AND TRADEMARK OFFICE
CERTIFICATE OF CORRECTION

PATENT NO. : 6,781,799 B2
DATED : August 24, 2004
INVENTOR(S) : Seyama et al.

It is certified that error appears in the above-identified patent and that said Letters Patent is hereby corrected as shown below:

Column 21,
Line 31, delete "6" and insert -- 8 -- therefor.

Column 22,
Line 11, delete "10" and insert -- 12 -- therefor.

Signed and Sealed this

Twenty-third Day of November, 2004

JON W. DUDAS
*Director of the United States Patent and Trademark Office*